United States Patent
Fujii et al.

(10) Patent No.: US 6,707,139 B2
(45) Date of Patent: Mar. 16, 2004

(54) SEMICONDUCTOR DEVICE WITH PLURAL UNIT REGIONS IN WHICH ONE OR MORE MOSFETS ARE FORMED

(75) Inventors: Isamu Fujii, Akishima (JP); Kiyoshi Nakai, Ome (JP); Yukihide Suzuki, Akishima (JP); Sadayuki Morita, Higashiyamato (JP); Hidekazu Egawa, Akishima (JP); Katura Abe, Higashimurayama (JP); Noriaki Sakamoto, Higashimurayama (JP)

(73) Assignees: Hitachi, Ltd., Tokyo (JP); Hitachi, ULSI Systems Co., LTD, Tokyo (JP)

( * ) Notice: Subject to any disclaimer, the term of this patent is extended or adjusted under 35 U.S.C. 154(b) by 0 days.

(21) Appl. No.: 09/928,497

(22) Filed: Aug. 14, 2001

(65) Prior Publication Data

US 2002/0030212 A1 Mar. 14, 2002

Related U.S. Application Data

(63) Continuation of application No. 09/385,631, filed on Aug. 27, 1999, now Pat. No. 6,274,895.

(30) Foreign Application Priority Data

Aug. 28, 1998 (JP) .......................................... 10-244009

(51) Int. Cl.[7] .............................................. H01L 23/48
(52) U.S. Cl. ...................... 257/678; 257/758; 257/207; 257/208; 257/211; 257/296
(58) Field of Search ................................ 257/758, 207, 257/208, 209, 110, 211, 296, 678; 438/197, 622

(56) References Cited

U.S. PATENT DOCUMENTS

| | | |
|---|---|---|
| 5,534,724 A | 7/1996 | Nagamine et al. .......... 257/390 |
| 5,773,857 A | 6/1998 | Ura .............................. 257/211 |
| 5,789,791 A | 8/1998 | Bergemont .................. 257/401 |
| 5,789,805 A | 8/1998 | Kanekawa et al. .......... 257/676 |
| 5,801,407 A | 9/1998 | Yamada ....................... 257/207 |
| 5,814,844 A | 9/1998 | Nagata et al. ............... 257/206 |
| 5,814,846 A | 9/1998 | Essbaum et al. ............ 257/207 |
| 5,841,157 A | 11/1998 | Kojima et al. .............. 257/202 |
| 5,847,421 A | 12/1998 | Yamaguchi .................. 257/207 |
| 5,880,493 A * | 3/1999 | Hidaka ........................ 257/210 |
| 5,892,249 A | 4/1999 | Courtright et al. .......... 257/209 |
| 5,894,142 A | 4/1999 | Fiduccia et al. ............. 257/207 |
| 5,898,194 A | 4/1999 | Gheewala .................... 257/206 |
| 5,917,207 A | 6/1999 | Colwell et al. ............. 257/206 |
| 5,929,469 A | 7/1999 | Mimoto et al. ............. 257/208 |
| 5,945,846 A | 8/1999 | Iwao et al. .................. 326/101 |
| 6,020,616 A | 2/2000 | Bothra et al. ............... 257/381 |
| 6,091,090 A | 7/2000 | Gheewala .................... 257/211 |
| 6,097,043 A | 8/2000 | Igarashi et al. ............. 257/207 |
| 6,097,621 A | 8/2000 | Mori ........................... 365/63 |
| 6,100,550 A | 8/2000 | Hidaka ........................ 257/210 |

* cited by examiner

Primary Examiner—Kamand Cuneo
Assistant Examiner—Lourdes Cruz
(74) Attorney, Agent, or Firm—Antonelli, Terry, Stout & Kraus, LLP

(57) ABSTRACT

A plurality of unit areas having one to a plurality of MOSFETs for implementing specific logic circuits are placed in a first direction. A first interconnection extending in the first direction is formed over each unit area. A second interconnection extending in the first direction is formed along the plurality of unit areas and outside the unit areas. Wiring dedicated areas provided with a third interconnection extending in a second direction intersecting the first direction are respectively provided between the adjacent unit areas. A logic circuit formed in each unit area has both a first connection form connected to the first interconnection and a second connection form connected to the third interconnection, via the second interconnection, according to combinations with the wiring dedicated areas adjacent thereto, as needed.

3 Claims, 12 Drawing Sheets

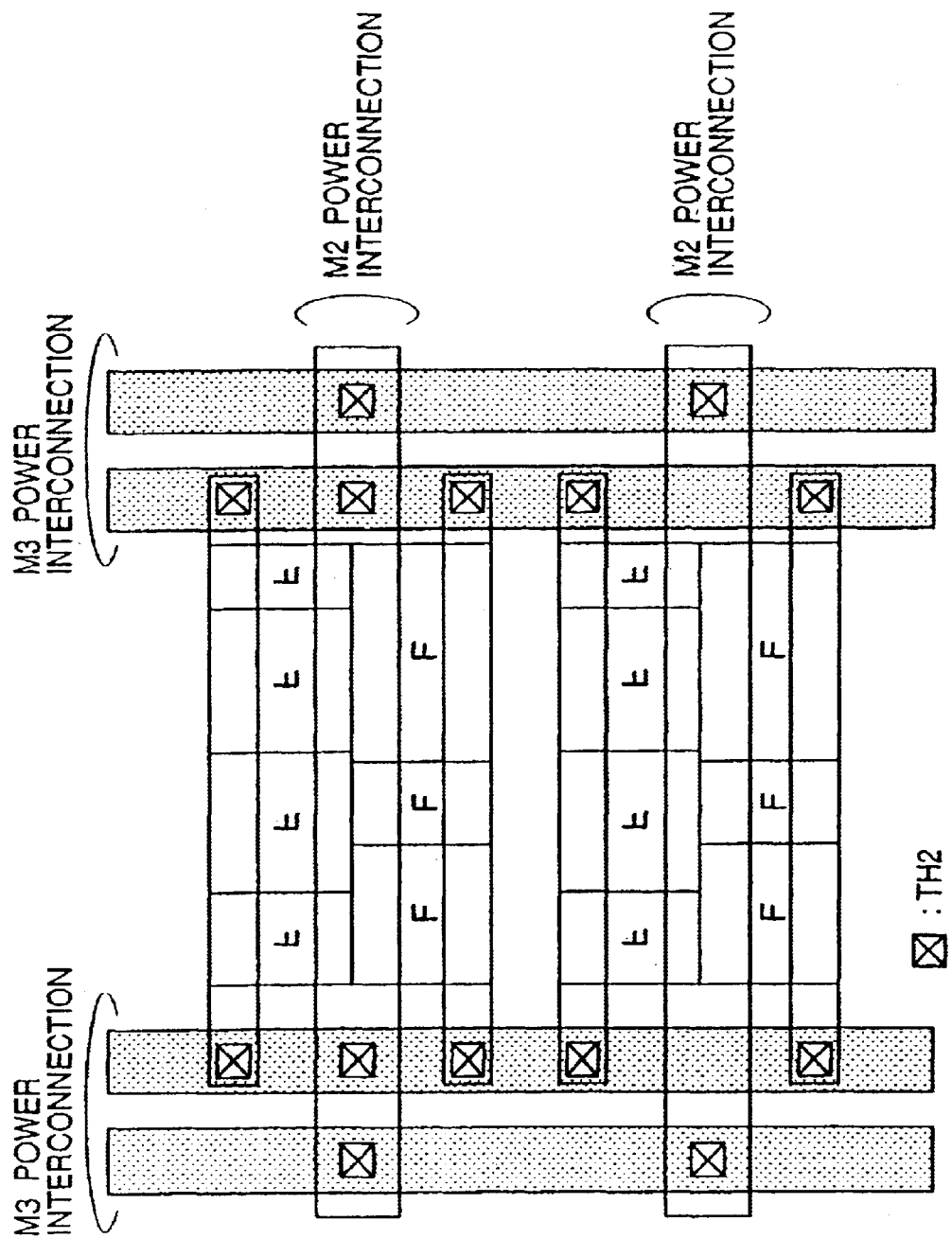

LAYOUT OF DIFFUSED LAYER

DIFFUSED LAYER FOR STABILIZED CAPACITY

DIFFUSED LAYER FOR STABILIZED CAPACITY

LAYOUT OF WIRING LAYER

M3 INTERCONNECTION LAYER

BONDING PADS

M2 INTER-CONNECTION LAYER

SEMICONDUCTOR DEVICE WITH PLURAL UNIT REGIONS IN WHICH ONE OR MORE MOSFETS ARE FORMED

This application is a continuation of application Ser. No. 09/385,631 filed Aug. 27, 1999 now U.S. Pat. No. 6,274,895.

BACKGROUND OF THE INVENTION

The present invention relates to a semiconductor integrated circuit device, and to a technique for laying out devices and interconnections employed in a dynamic RAM (Random Access Memory) wherein peripheral circuits comprised of random logic CIRCUITS and bonding pads are placed in a central portion of a semiconductor chip, for example.

An example of a dynamic RAM wherein bonding pads and their corresponding peripheral circuits are disposed in a central portion of a semiconductor chip is disclosed in U.S. Pat. No. 5,602,771 (Feb. 11, 1997). In the dynamic RAM disclosed in this patent, areas which constitute the peripheral circuits are provided crosswise in vertical and horizontal central portions of a memory chip. Memory arrays are laid out in areas divided into four parts by the cross-shaped areas.

SUMMARY OF THE INVENTION

A dynamic RAM comprises memory array portions formed by regular circuit patterns, and peripheral circuits each comprised of a random/logic circuit. Since the peripheral circuits are individually designed according to the storage capacity of each memory array or the type of operation mode, many design man-hours are spent to design such peripheral circuits and to lay them out. Therefore, the present inventors have sought a way of reducing the design man-hour of the random/logic circuit.

An object of the present invention is to provide a semiconductor integrated circuit device which is capable of implementing a rational layout of devices and interconnections. Another object of the present invention is to provide a semiconductor integrated circuit device which is capable of implementing a rational layout of circuit devices without degrading the performance of each circuit. The above, other objects and novel features of the present invention will become apparent from the description provided in the present specification and the accompanying drawings.

A summary of a typical aspects of the invention disclosed in the present application will be described in brief as follows. There is provided a semiconductor integrated circuit device wherein a plurality of unit regions or areas in which one or plural MOSFETs for implementing a specific logic circuit are formed, which unit regions or areas extend in a first direction, a first interconnection extending in the first direction is formed over the unit areas, a second interconnection extending in the first direction is formed along the unit areas and outside the unit areas, and each of the wiring dedicated areas is provided with a third interconnection extending in a second direction orthogonal to the first direction between the adjacent unit areas, a logic circuit formed in each unit area is constructed so as to have both a first connection form connected to the first interconnection and a second connection form connected to the third interconnection through the second interconnection, according to combinations with the wiring dedicated areas adjacent thereto as needed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 8 is a wiring layout diagram for describing one embodiment illustrative of the supply of power to peripheral circuits constructed by the circuit blocks shown in FIG. 1;

DETAILED DESCRIPTION OF THE INVENTION

Preferred embodiments of the present invention will hereinafter be described with reference to the accompanying drawings.

Figure 1:
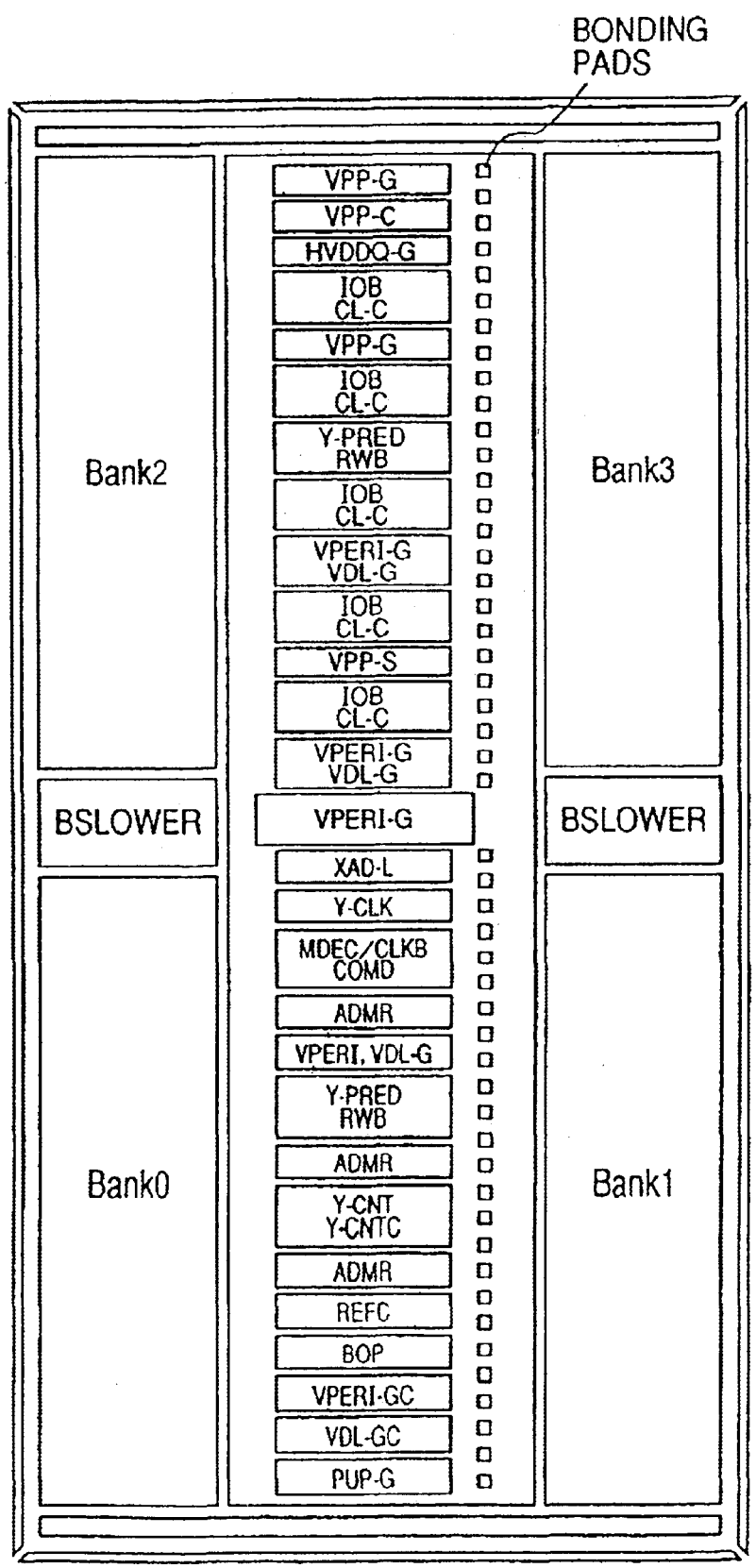
FIG. 1 is a schematic layout diagram showing one embodiment of a dynamic RAM according to the present invention.

FIG. 1 schematically shows the layout of one embodiment of a dynamic RAM according to the present invention. Respective circuit blocks shown in the drawing are formed over a single semiconductor substrate such as monocrystal silicon, by a known semiconductor integrated circuit manufacturing technology. Respective circuits in the drawing are drawn so as to substantially match a geometrical arrangement on the semiconductor substrate. In the present embodiment, a memory array is divided into four parts as a whole in the same manner as described above and is set so as to constitute memory banks (Bank) 0 through 3.

The memory banks 0 through 3 are arranged memory arrays located two by two in upward and downward directions along the longitudinal direction of a semiconductor chip and located two by two from side to side. Peripheral circuits each comprised of an address input circuit, a data input/output circuit and a bonding pad sequence are provided in a central portion extending along the longitudinal direction of the chip. The peripheral circuits are constructed so that random/logic circuits and bonding pads are arranged side by side to rationalize the layout of the respective circuits comprised of the random/logic circuits.

In the dynamic RAM described in the aforementioned publication, the bonding pads and the peripheral circuits are linearly arranged side by side in the central portion extending along the longitudinal direction of the semiconductor chip. In this construction, the number of bonding pads is limited and the distance for connection between each bonding pad and each peripheral circuit increases. In the present embodiment, the peripheral circuits and the bonding pad sequence are placed side by side. In the present construction, the bonding pad sequence is placed in a position shifted or deviated from the center line extending along the longitudinal direction of the semiconductor chip. As a result, a relatively large integrated area can be ensured in the central portion extending along the longitudinal direction of the semiconductor chip. It is suitable for the layout design of circuit elements or devices to be described later. Namely, even the construction in which the peripheral circuits and the bonding pad sequence are placed side by side is suitable for use in high integration and high speed circuit devices as compared with the case in which the peripheral circuits are placed in part from side to side with the bonding pads at the center.

The dynamic RAM according to the present embodiment is intended for a synchronous DRAM to be described later. The peripheral circuits include the following respective circuit blocks, which are provided in the central portion of the upper half extending along the longitudinal direction of the semiconductor chip in the drawing. VPP-G indicates a boosted voltage generator, which is used to provide operating voltages for a circuit for selecting a word line to which each memory cell is connected, or a selection circuit comprised of shared switch MOSFETs to be described later, thereby to determine a select level. VPP-C indicates a control circuit for controlling the operation of the boosted voltage generator.

HVDDQ-G is used to form a voltage obtained by dividing a source voltage VDD into ½, which serves as a reference voltage for an input buffer comprised of a differential circuit and is used to make a decision as to a high level/low level of an input signal having a VDD amplitude. IOB and CL-C indicate an input/output circuit and a clock control circuit, respectively. The circuit CL-C is used to control the operation corresponding to CAS latency of an output buffer. Five similar circuits are provided in total as the circuits IOB and CLC.

Y-PRED and RWB indicate a Y predecoder and a read/write buffer, respectively. The read/write buffer performs control on the operation of each main amplifier and carries out the operation of each write amplifier. VPERI-G and VDL-G indicate de-boosted voltage generators, respectively, and generate a de-boosted operating voltage VPREI for each peripheral circuit and an operating voltage VDL for a sense amplifier. As these de-boosted voltage generators, two similar circuits are additionally provided. VPP-S indicates a VPP sensor for detecting whether a VPP voltage is a desired voltage. A stabilization capacitor VPERI-C for stabilizing the de-boosted voltage VPERI is provided in the central portion of the semiconductor chip.

The following respective circuit blocks are provided in a central portion of a lower half extending along the longitudinal direction of the semiconductor chip in the drawing.

XAD-L indicates an X address latch circuit, and Y-CLK indicates a Y clock circuit which generates a clock signal corresponding to the operation of a Y system. MPEC/CLKB and COMD indicate a mode decoder/clock buffer and a command circuit, respectively. ADMR indicates an address mode register. A circuit similar to this is further provided. Y-CNT and Y-CNC indicate a Y counter and a control circuit therefor. REFC indicates a refresh control circuit, BOP indicates a bonding option circuit, and PUP-G indicates a power-on detection circuit, respectively.

The bonding pads are formed so as to be substantially linearly arranged along the plurality of circuit blocks referred to above. As compared with the peripheral circuits placed in part from side to side with the bonding pads interposed therebetween, the present construction makes it possible to speed up the operation because signal transfer routes in the respective circuit blocks can be formed in a short length without being undesirably lengthened to avoid the bonding pads. Since one circuit block can be formed focusedly on the integrated area, it facilitates the layout of the circuit devices, which takes into consideration automatic routing or wiring to be described later.

In the present embodiment, other peripheral circuits BSLOWER are provided in a transversely-extending central portion of the semiconductor chip. Although the invention is not restricted in particular, each peripheral circuit BSLOWER is provided with a failure relief circuit for replacing a failure in memory array (memory bank), i.e., a defective word line with a spare word line or replacing a defective or faulty bit line with a spare bit line.

Figure 2:
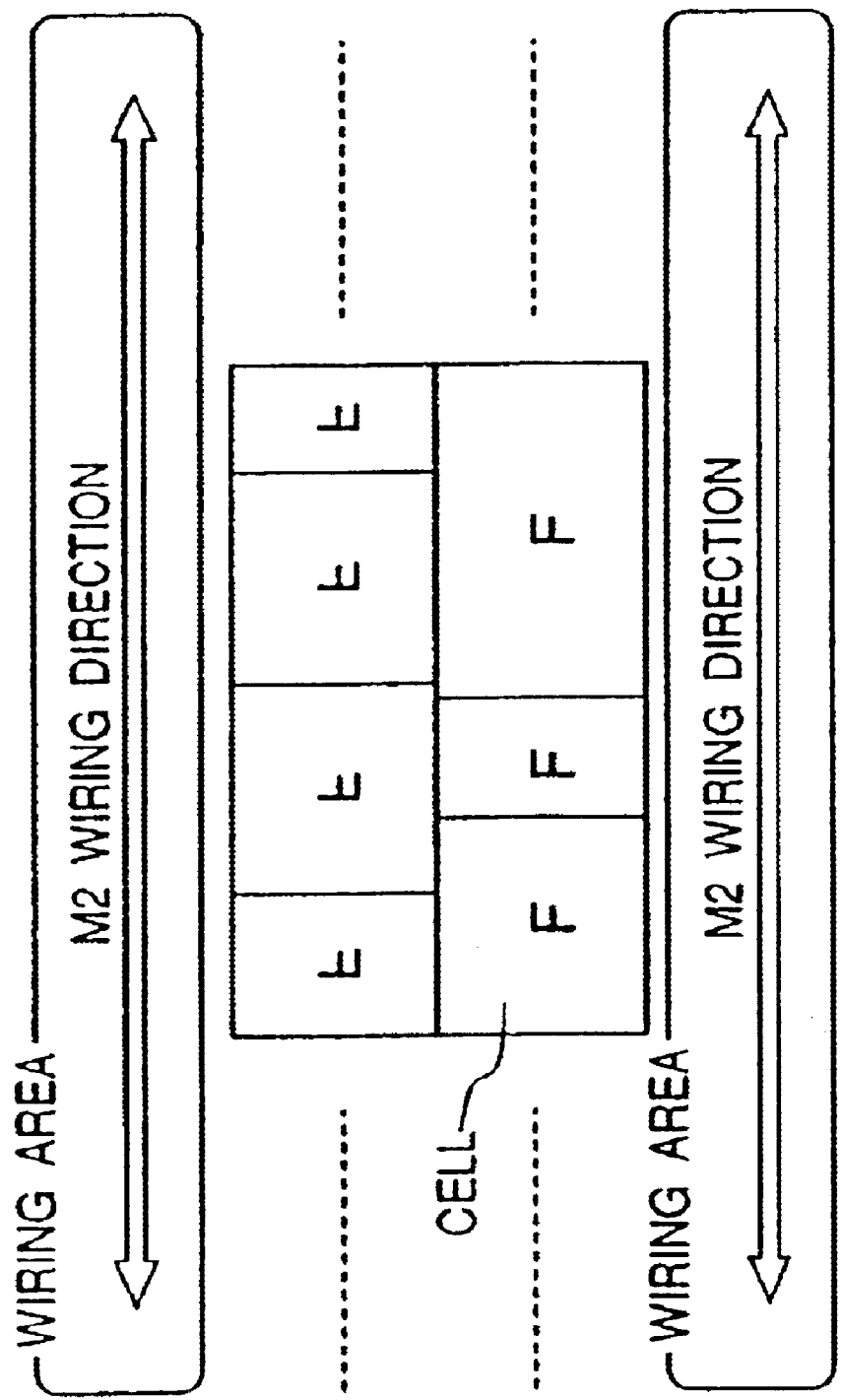
FIG. 2 is a schematic device layout diagram illustrating one embodiment of each circuit block shown in FIG. 1.

FIG. 2 is a schematic device layout diagram showing one example corresponding to each circuit block referred to above. Each circuit block comprises a combination of a plurality of unit areas (hereinafter called "cells"). Each cell constitutes one logic function and is made up of a combination of basic logic circuits such as a gate circuit, an inverter, etc. The cell has at least one input terminal. In the drawing, a character F affixed to each cell indicates the direction of the cell. In the present embodiment, a cell sequence placed on the right side in the drawing and a cell sequence placed on the left side are arranged back to back. Namely, the right cell sequence and the left cell sequence take a mirror-inverted form with respect to the center line with which the two cell sequences are in contact. Wiring dedicated areas are provided on both sides along the two cell sequences. A metal layer M2 corresponding to a second layer is used for each wiring dedicated area.

Figure 3:
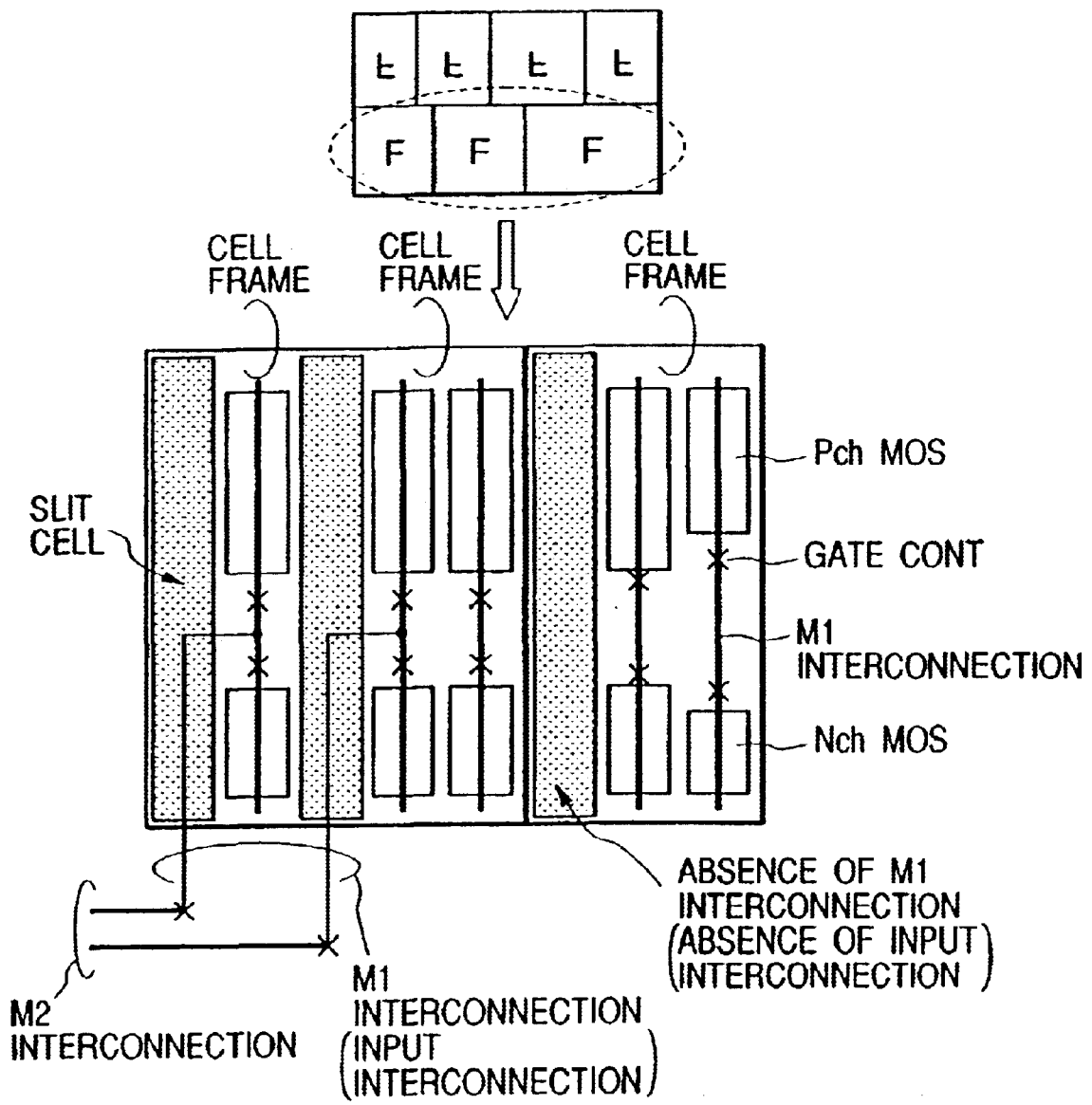
FIG. 3 is a schematic device layout diagram depicting one example illustrative of cells constituting the circuit block shown in FIG. 1.

FIG. 3 is a schematic device layout diagram showing one example illustrative of three cells which constitute the above-described circuit block. One or two P channel type MOSFETs (PchMOS) and one or two N channel type MOSFETs (NchMOS) are formed in their corresponding cell frames. Although the invention is not restricted in particular, the P channel type MOSFETs are placed on the upper side with the direction of each cell indicated by the character F as the reference, whereas the N channel type MOSFETs are similarly placed on the lower side. In the drawing, gate electrodes are respectively indicated by individual thick lines, and diffusion layers are formed so as to interpose the gate electrodes interposed therebetween, whereby they are formed as source and drain regions. The relationship between the direction of such a cell and the placement of the P channel type MOSFETs (PchMOS) and N channel type MOSFETs (NchMOS) is similar to the following in all embodiments.

Although the invention is not restricted in particular, each individual pairs of P channel type MOSFETs and N channel type MOSFETs constituting CMOS circuits are placed so that the gate electrodes are arranged in line. Conductive polysilicon layers, which constitute the gate electrodes, are respectively electrically connected to metal wiring layers M1 each corresponding to a first layer by gate CONT (contacts) at points indicated by marks X. Thus, the gate electrodes of the P channel type MOSFETs and N channel type MOSFETs associated with each other are connected in common through the metal layers M1 corresponding to the first layer.

Since only one P channel type MOSFET and one N channel type MOSFET are formed within a cell at the left end, the source region of each P channel type MOSFET is, although not shown in the drawing, electrically connected to its corresponding source line supplied with an operating voltage such as a source voltage VDD (or VPERI), and is comprised of a metal layer M2 corresponding to a second layer extending in the transverse direction on the upper side of each cell frame as will be described later. The source region of each N channel type MOSFET is, although not shown in the drawing, electrically connected to its corresponding source line supplied with an operating voltage such as a circuit ground potential VSS like 0V, and is comprised of the metal layer M2 corresponding to the second layer extending in the transverse direction on the lower side of each cell frame as will be described later. Wiring channels each comprised of the metal layer M2 corresponding to the second layer in the same manner as described above are provided in the central portion of the cell sequence with no source line.

Two P channel MOSFETs and two N channel type MOSFETs are formed within the central and right-end cells. Corresponding gate electrodes thereof are commonly connected as described above. Thus, when the two P channel type MOSFETs are electrically connected in parallel, the voltage like VDD or VPERI is commonly applied to the sources thereof The source of one of the N channel type MOSFETs and the drain of the other N channel type MOSFET are electrically connected to each other in series. The circuit ground potential VSS is applied to the source of the other MOSFET, and the drain of one MOSFET is electrically connected to the commonly-used drains of the P channel type MOSFETs so as to serve as an output terminal. The commonly-used gate electrodes are set as two input terminals as described above, an and (NAND) gate circuit can be constructed when positive logic with a high level as the logical 1 is adopted.

The sources and drains of the N channel type MOSFETs or the sources or drains of the parallel-configured P channel type MOSFETs can be electrically connected to one another without the special interconnections Ml by forming diffusion layers in common as in the case of the connections between the gate electrodes. In order to clearly represent the MOSFETs constituting the cells in the same drawing, the respective MOSFETs are represented so that the sources and drains are respectively formed with the gate electrodes interposed therebetween.

When the P channel type MOSFETs are electrically connected in series and the N channel type MOSFETs are electrically connected in parallel to the contrary, a nor (NOR) gate circuit can be formed when the positive logic is adopted. Thus, various logic circuits or various logical functions comprised of their combinations can be implemented according to changes in the number of MOSFETs formed within each cell frame and their connection forms. As the logical functions, various functions are known which include, for example, a latch circuit and a counter circuit such as a flip-flop circuit, a circuit such as a comparison coincidence circuit including a relatively large circuit scale, etc. in addition to the inverter and logical functions described above. The flip-flop circuit, counter circuit and comparison coincidence circuit or the like may be broken down into their corresponding logic gates as cells.

The cells employed in the present embodiment represent those supplied with at least one input signal from other than the cells. In other words, a circuit in which signal transfer routes are formed by a plurality of logic gate circuits alone, even of circuits constructed of a plurality of logic gates as in a flip-flop circuit, a counter circuit and a comparator or the like as described above, more specifically, logic circuits constructed by only an electrical connection which shares the use of the diffusion layers for the source and drain, and an electrical connection based on the wiring layer Ml corresponding to the first layer, can be regarded as one cell regardless of the size of the circuit scale.

When a plurality of inverters are electrically connected in tandem to form a delay circuit, for example, a large number of P channel MOSFETs and N channel type MOSFETs corresponding to the number of the inverters are provided. Since, however, signals outputted from the preceding stages are transferred to the inputs of the inverters except for the initial-stage inverter, they are regarded as one cell having one input terminal. Since the inputs and outputs of latch circuits, in which the inputs and outputs of two inverters are electrically cross-connected, are electrically cross-connected to one another, they can be handled as a cell using the input of one inverter, whose output impedance (output driving ability is produced high) is produced low, as one input terminal.

In the cell sequence, the source lines are placed on both sides of the cell sequence in association with the P channel MOSFETs and N channel type MOSFETs as described above. The wiring channels each comprised of the metal layer M2 corresponding to the second layer are formed in the central portion with no source lines formed therein and are used for interconnections for supplying an input signal to each cell or interconnections for transferring an output signal to the next-stage cell.

In the present embodiment, slit cells used as wiring for dedicated areas are provided for all cells referred to above. Thus, the slit cells are integrally provided within their corresponding cell frames. Each slit cell is provided with a metal layer M1 corresponding to the first layer as needed. Namely, the interconnections are basically formed within the cells and connect between the cells by using the wiring channels formed so as to extend the central portion of the cell sequence. However, when the number of interconnections is insufficient, the slit cells are utilized. Namely, when the number of the interconnections for transferring the input signal to the cells is insufficient, the metal layers M1 each corresponding to the first layer are formed in the corresponding slit cell and are electrically connected to their corresponding metal layers M2, each corresponding to the second layer extending outside the cell sequence.

The layout design of each random/logic circuit is performed as follows. After its circuit design, such a circuit is broken down into cells, which in turn are laid out and placed, and the design of wiring between the cells can be automatically performed by a computer. However, when the number of interconnections provided in the central portion of the cell sequence is insufficient, the interconnections remain non-wired or a short circuit in other interconnections is developed. Accordingly, the conventional circuit layout technology needs to re-layout the design of the cells in which wiring errors occur. However, the construction in which the slit cells are provided in the respective cells, as in the present embodiment, makes it possible to perform automatic wiring which selects such slit cells and is performed in combination with the wiring channels provided outside the cell sequence upon the occurrence of a shortage of input signal routes in the automatic wiring design, owing to the inputting of information that the wiring routes based on such slit cells exist.

Thus, the left-side cell and central cell as in the embodiment shown in the drawing can take in signals sent from other cells as inputs according to the combination of the metal layer M1 corresponding to the first layer using the slit cell and the metal layer M2 corresponding to the second layer provided outwardly along the cell sequence. The input signal is transferred to the other input terminal of the central cell through the interconnection provided in the central portion of the cell sequence. When a signal outputted from, for example, the central cell or the like adjacent to the right-side cell is transmitted through a wiring channel provided in the central portion of the cell sequence, the metal layer M1 corresponding to the first layer is not formed in the right-side cell even though the slit cell is provided.

In the present embodiment, there are two forms. In one form, when one cell has a plurality of input terminals, a signal transmitted to at least one input terminal is sent through the use of the metal layer M1 formed in each slit cell and signals transmitted to other input terminals are sent through the use of the wiring channels each using the metal layer M2 corresponding to the second layer provided in the central portion of the cell sequence. In the other form, all the input signals are sent through the use of only the wiring channels using the metal layer M2 corresponding to the second layer provided in the central portion of the cell sequence and the slit cell is not used.

While the slit cells are placed in all cells in the present embodiment, the invention does not necessarily require the provision of the slit cells in all cells. When, for example, only one input terminal is provided upon circuit design and receives only a signal outputted from an adjacent cell, and when it is found in advance that the wiring channels provided in the central portion of the cell sequence are left over, the slit cells can be omitted.

Thus, when the slit cells are selectively provided, they are regarded as one cell and are selectively provided between the present device formed with the logic gate circuits or the like and each cell. The selective provision of the slit cells as such wiring dedicated areas allows a reduction in the area occupied by each circuit block comprised of a plurality of cell sequences. Thus, the decision as to whether each slit cell should be provided may be entrusted to the experience of a circuit designer. Even if the decision for the insertion of the slit cells according to experience is found to be a mistake, cell re-designed points can be greatly reduced. Therefore, the present embodiment can contribute to a great reduction in the design time based on the automatic wiring design technology.

Figure 4:
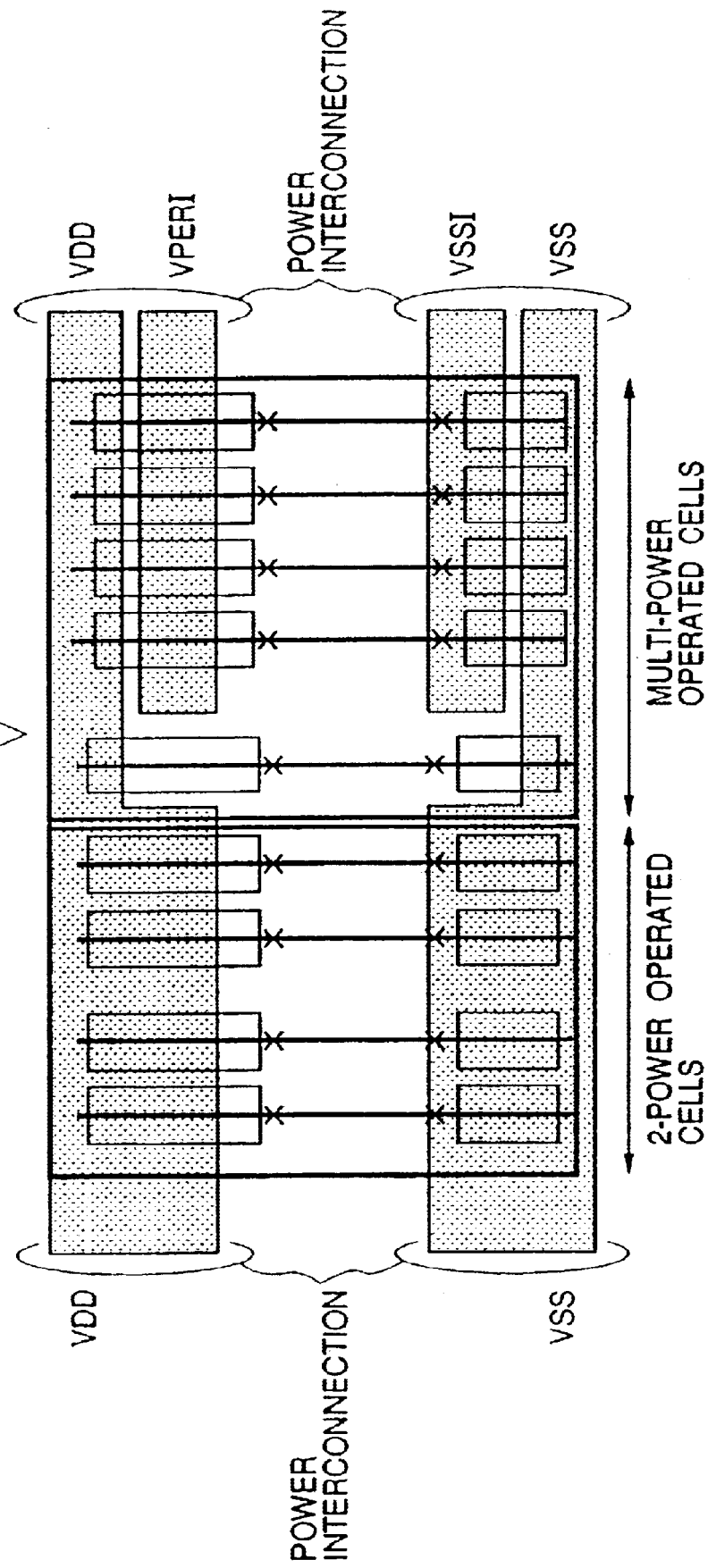
FIG. 4 is a schematic device layout diagram showing another example illustrative of the cells constituting the circuit block shown in FIG. 1.

FIG. 4 is a schematic device layout diagram showing one example illustrative of the two cells constituting the circuit block. In a dynamic RAM, an internal circuit is operated by a de-boosted voltage VPERI for purposes of low power consumption and speeding up or the like. In the semiconductor integrated circuit device using such an internal de-boosted voltage, input circuits such as an input buffer circuit, etc. include a circuit operated through two source lines having a source voltage VDD supplied from an external terminal for receiving a signal level corresponding to the source voltage VDD and a circuit ground potential VSS, and a circuit operated by such a de-boosted internal voltage VPERI and the ground potential VSS. A circuit operated by three or more multiple sources like VDD, VPERI and VSS exists in each cell provided between the circuits operated by such different voltage systems.

The present embodiment shows an example illustrative of the layout of source lines at the time that two-power operated cells activated by VDD and VSS and a multi-power operated cell activated by VDD and VPERI, and VSS and VSSI are placed side by side. When the cells based on the different source system are placed side by side as described above to construct one circuit block, the two source lines with the source voltages VDD and VSS taken as the basics are respectively formed on both sides of a cell sequence so as to correspond to P channel and N channel type MOSFETS.

When the multi-power operated cells operated by VDD, VPERI and VSS and VSSI are placed side by side with the two-power operated cells with a power wiring width of each two-power operated cell as a base, the wiring width used as the base is divided among VDD, VPERI and VSS and VSSI. Since the occupied width of each source line can be made constant owing to such a construction even when one circuit block has two sources and three or more multi sources, elements or devices having a good efficiency and width of the wiring channel provided in the central portion of a cell sequence can be ensured. From another viewpoint, cells of the same height, of the two-power operated cells and the three or more multi-power operated cells, can be placed side by side so as to configure each circuit block, and random/logic portions can be regularly provided as viewed from above each cell.

Even if each input part operated by the source voltage VDD and each internal circuit operated by VPERI are provided in a mixed form, the multi-power operated cells can supply voltages corresponding to their operating voltages owing to the source configuration. The reason why the circuit ground lines are separated as in the case of VSS and VSSI, is as follows. When, for instance, relatively large noise is produced in the ground line VSS due to the operation of each input circuit with a relatively large signal amplitude, the ground line for each internal circuit wherein the signal amplitude is reduced by the de-boosted voltage VPERI, so as to decrease the level margin, is separated as in the case of VSSI, whereby the influence of the noise produced in the input circuit can be reduced.

Similarly, even in the case of an output-system circuit for outputting a de-boosted internal signal to an external terminal, the separation of ground lines into VSSI and VSS is useful. Namely, in an output-system circuit for outputting the converted output signal to an output terminal, the level converter can be used in the cells operated by VSSI, VPERI and VDD and the cells each constituting an output circuit operated by VDD and VSS as described above.

In the dynamic RAM, the amplitude of a signal on a bit line connected to each memory cell, as will be described later, is set to a voltage VDL further de-boosted from VPERI. The voltage VDL is utilized as an operating voltage for each sense amplifier. Even in the case of a circuit for converting a signal of a VDL level read from the corresponding memory cell into the VPERI level, level-converting circuit exists and cells operated by three or more multiple sources of VDL, VPERI and VSS or VSSI exist.

They can be utilized even in such a circuit block in the same manner as described above.

Figure 5:
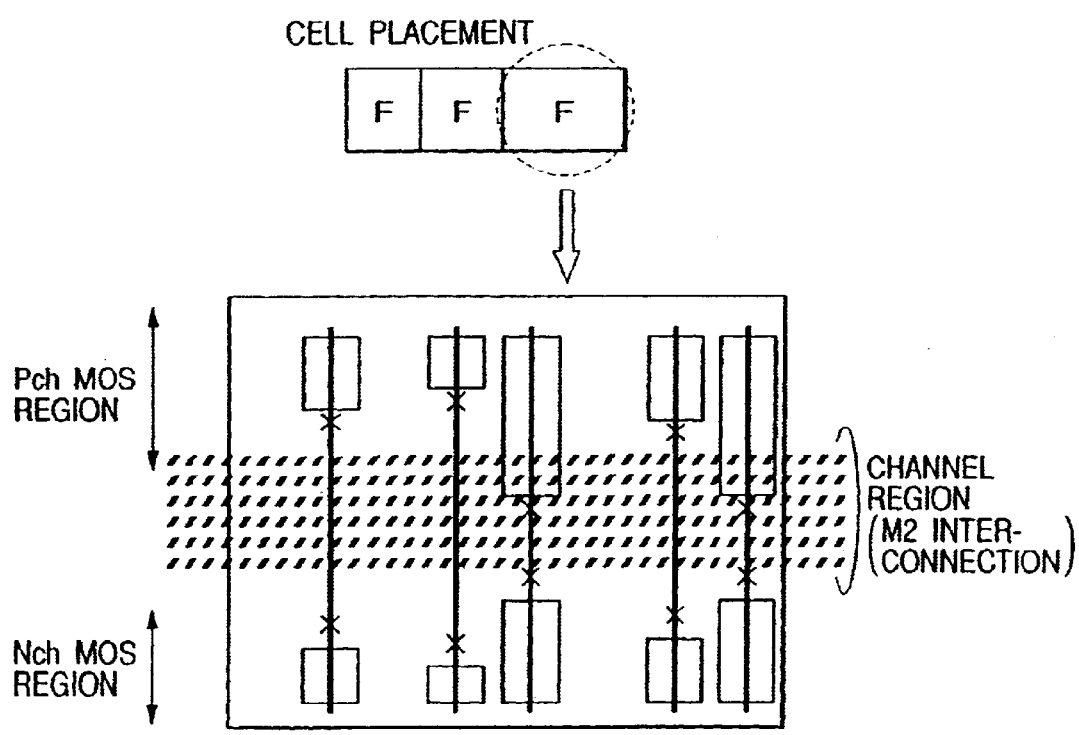
FIG. 5 is a schematic device layout diagram illustrating a further example of the cell constituting the circuit block shown in FIG. 1.

FIG. 5 is a schematic device layout diagram showing a further example of one cell constituting the circuit block. In a logic circuit, MOSFETs are not constant in size and differ from one another in device size according to their functions and required current driving capability. With respect to the device sizes of the MOSFETS, the gate length of each MOSFET is constant and the gate width thereof is set according to the current driving capability (conductance) with the exception of a special case.

In the present embodiment, the size of each cell is formed so as to have a constant height (corresponding to the width as viewed in the direction of the cell sequence) since the source lines are placed on both sides as described above. The sizes of the MOSFETs formed within each cell having such a constant height are set to various forms according to the circuit constants as described above. When MOSFETs which are different in size from one another are placed within each cell, the channel width of each MOSFET is set with both sides of each cell frame as the reference in the present embodiment. Namely, the upper ends of the sources and drains of P channel type. MOSFETs (PchMOS) placed on the upper side of each cell frame are disposed so as to be aligned on the upper side of the cell frame. Further, the lower ends of the sources and drains of N channel type MOSFETs (NchMOS) placed on the lower side of each cell frame are disposed so as to be aligned on the lower side of the cell frame.

As a result of the alignment of the ends of the source and drains of the P channel and N channel type MOSFETs set low in current driving capability on their corresponding upper and lower ends, M1 interconnections for electrically connecting between gates are formed so be long in the present construction. On the other hand, M1 interconnections for electrically connecting between gates are formed to be relatively short as a result of the alignment of the ends of the sources and drains of the P channel and N channel type MOSFETs set to have a large current driving capability on their corresponding upper and lower ends.

Wiring channels each based on a metal layer M2 corresponding to a second layer, as indicated by thick dotted lines in the drawing, are formed in a central portion except for the source lines placed on both sides of each cell frame as described above. In the aforementioned device configuration, the M1 interconnections for electrically connecting between the gates of the P channel and N channel type MOSFETs, which are set to have a large current driving capability, are formed to be relatively short. As a result, the connectable interconnections in the wiring channels M2 are limited to a small number. Accordingly, the wiring channels, which constitute routes for an input signal are preferentially assigned to circuits set to such large device sizes.

On the other hand, the M1 interconnections for electrically connecting between the gates of the P channel and N channel type MOSFETs which have a small current driving capability are formed to be relatively long, so that the connectable interconnections in the wiring channels M2 increase in number. Even if the wiring channels are preferentially assigned to the circuits set to the large device sizes, the wiring channels that the circuits set to the large device sizes are unable to use, are left behind, and hence electrical connections using such interconnections are allowed. Thus, the wiring channels for electrically connecting between the devices can be rationally utilized.

The construction will cause another advantage. If MOSFETs which are small in size are placed so as to approach the central portion of the cell sequence, it is necessary to provide an electrical connection between their sources and source lines using metal layers M1 each corresponding to a first layer. The metal layers are formed in a relatively fast step of diverse manufacturing processes for the semiconductor integrated circuit. Thus, a metal material having a high melting point, such as tungsten or the like whose sheet resistance value is relatively large, is used to make the metal layer resistant to the influence of heat treatment in the subsequent manufacturing process.

Thus, according to the construction wherein the MOSFETs which are small in size are placed so as to approach the central portion of the cell sequence, a wiring resistance electrically connected to the source of each MOSFET used as an amplifying element acts in a gate-to-source voltage reducing direction due to a current flowing through each MOSFET to provide negative feedback, whereby the signal transfer rate is reduced. On the other hand, according to the construction wherein the MOSFETs which are small in size are placed apart at the end of the cell sequence, as in the present application, the same wiring resistance is electrically connected to the gate on the input side and no negative feedback occurs as in the case in which it is electrically connected to the source as described above, whereby switching can be speeded up.

Figure 6:
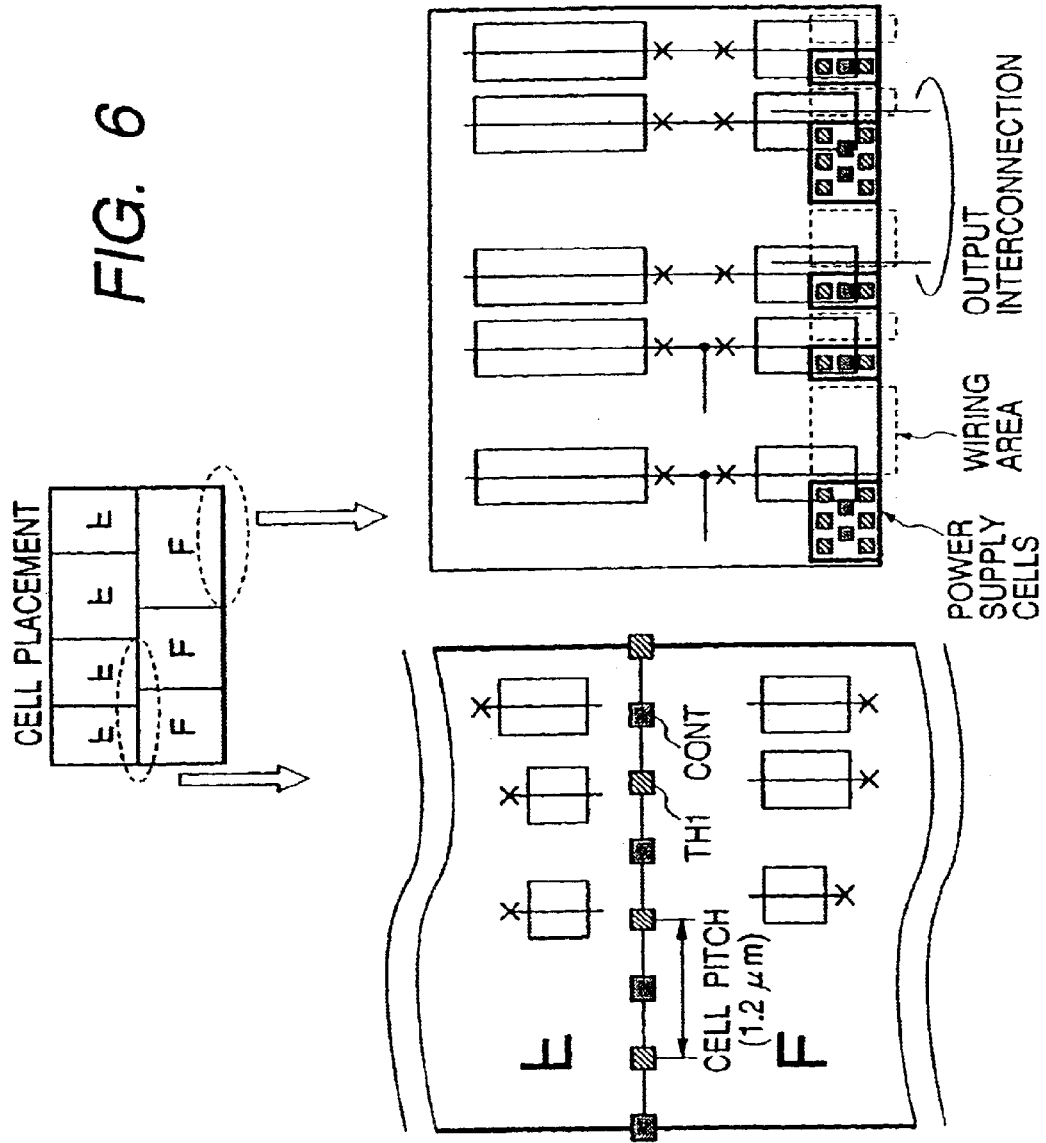
FIG. 6 is a schematic device layout diagram depicting a still further example illustrative of the cells constituting the circuit block shown in FIG. 1.

FIG. 6 is a schematic device layout diagram showing a still further example illustrative of a plurality of cells constituting the circuit block. In the present embodiment, two cell sequences are placed back to back as described above. Owing to such a construction, P channel type MOSFETs are formed on the upper side as viewed in the direction of each cell indicated by a character F. The P channel type MOSFETs can be formed within the same N-type well region in the two cell sequences. Further, a source voltage VDD or an internal de-boosted voltage VPERI (VDL) can be shared between the two cell sequences. Thus, since the width of each source interconnection can be reduced to half as viewed from one cell sequence, the width of a wiring channel provided in the central portion of the cell sequence is reduced, whereby the number of interconnections can be greatly increased.

As a premise condition for using the source line in common, the cell pitch and the pitch of each contact CONT of a power supply portion are set to be identical to each other. Here, the cell pitch corresponds to the minimum pitch of each interconnection employed in the semiconductor integrated circuit. Upon automatic wiring, interconnections corresponding to second and third layers are formed according to the pitch referred to above. When the two cell sequences are placed back to back and the source line is used in common, the condition that the pitch of each contact is matched with the cell pitch, is additionally set. As a result, the contact CONT and each through hole TH provided on the source line shared between the two cell sequences placed back to back can be matched with each other. Here, the contact CONT indicates a portion for connecting diffusion layers for the source and drain and a diffusion layer for an ohmic contact formed in a well, and a metal wiring layer Ml corresponding to a first layer. The through hole indicates a portion for connecting the metal wiring layer Ml, corresponding to the first layer, and a metal wiring layer M2, corresponding to a second layer, to each other.

When each of the diffusion layers formed on the left side with a gate electrode of each N channel type MOSFET interposed therebetween is set as the source, each power-supply cell comprised of the contact CONT and the through hole TH provided in association with the above-described cell pitch is formed in a diffusion layer corresponding to the source and a P-type well region. A region corresponding to the drain is defined as a wiring region. Output interconnections each based on the metal wiring layer M1 corresponding to the first layer connected to the wiring channel (M2) formed outside along the cell sequence, for example, are formed in such a wiring region.

Figure 7:
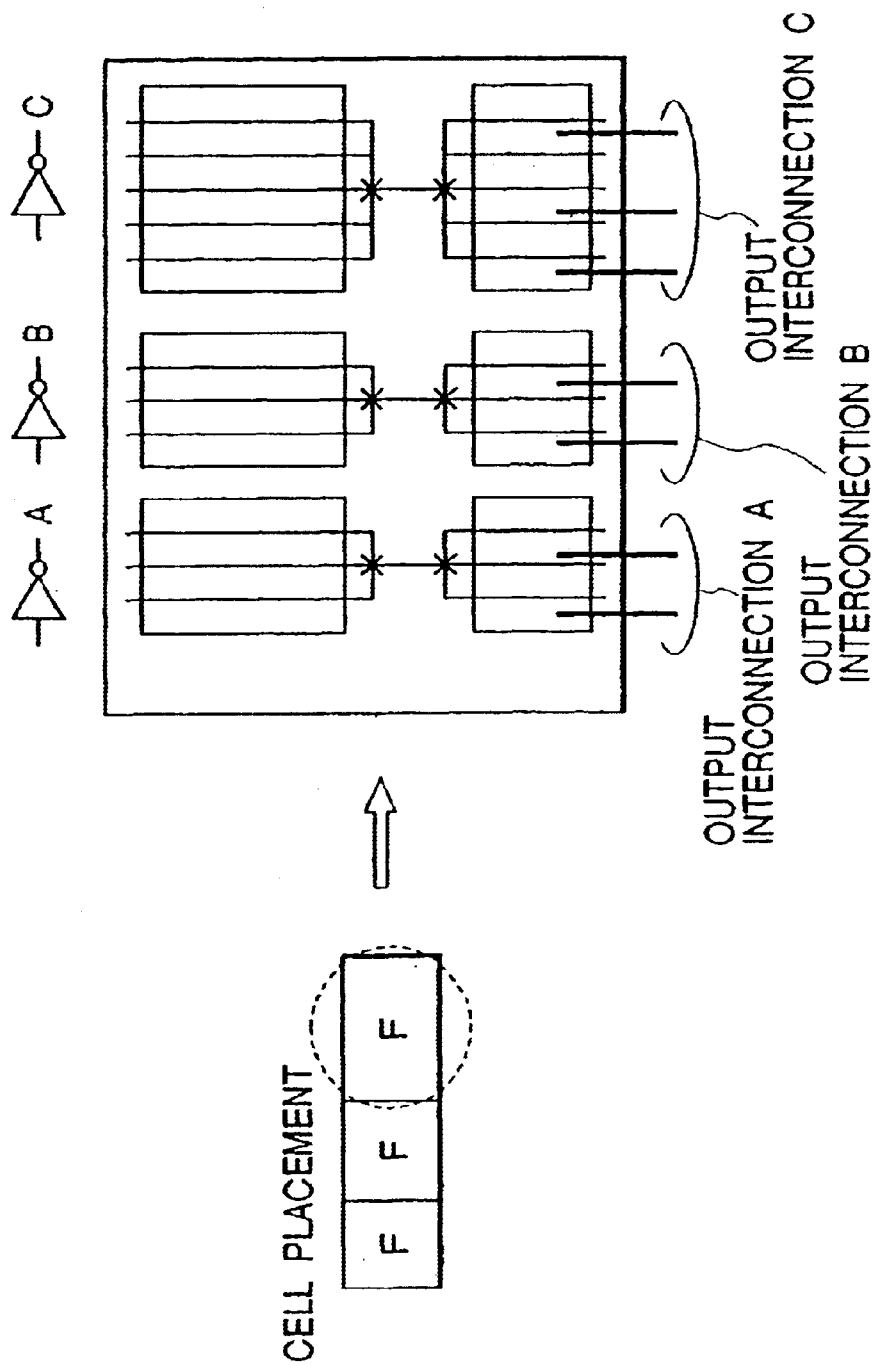
FIG. 7 is a schematic device layout diagram showing a still further example of the cell constituting the circuit block shown in FIG. 1.

FIG. 7 is a schematic device layout diagram showing a still further example illustrative of a plurality of cells constituting the circuit block. In the present embodiment, output interconnections have been devised. In the present embodiment, one MOSFET is equivalently comprised of a plurality of parallel-connected MOSFETS. Two CMOS inverters, which produce outputs A and B therefrom, are constructed so that three basic MOSFETs limited according to the height of each cell are parallel-connected to be used as one MOSFET. Namely, four diffused layers are formed by three gate electrodes and are used like the drain, source, drain and source in order from the left side, for example. The source and drain excluding the drain and source at both ends are respectively used jointly as the sources and drains of two MOSFETS. In a CMOS inverter which produces an output C, six diffused layers are formed by five gate electrodes and are used like the drain, source, drain, source, drain and source in order from the left side, for example.

Thus, when the plurality of MOSFETs are parallel-connected so as to be used as one MOSFET, it is possible to cause a large current to flow inevitably. In order to take out such a large current with efficiency, two or three output lines are provided in association with the drain. Namely, in order to use a metal layer M1 corresponding to a first layer having a relatively large resistance value in the output lines withdrawn from the cells, a plurality of output lines are provided as described above so that the wiring resistance thereat can be reduced. Although not shown in the drawing, interconnections for connecting the drains of the MOSFETs formed within the same cell to one another and connecting the sources thereof to one another are formed by the wiring layer M1 corresponding to the first layer in the same manner as described above.

FIG. 8 is a wiring layout diagram for describing one example illustrative of the supply of power to peripheral circuits constructed by the above-described circuit blocks. The circuit blocks in which the two cell sequences are placed back to back as described above, are arranged in the direction orthogonal to each cell sequence, so that the peripheral circuits provided along the bonding pad sequence are constructed as shown in FIG. 1.

In the present embodiment, source supply interconnections for the plurality of circuit blocks have been devised. Namely, source interconnections each comprised of a metal layer M3 corresponding to a third layer are formed along both sides of the circuit block sequence. The corresponding source lines placed on both sides of the circuit block sequence, which are comprised of a metal layer M2 corresponding to a second layer for supplying power to each circuit block, are electrically interconnected with each other via through holes TH2. Thus, the source impedance can be reduced by providing the source lines in ladder form through the use of the source lines for the circuit blocks.

Figure 9A:
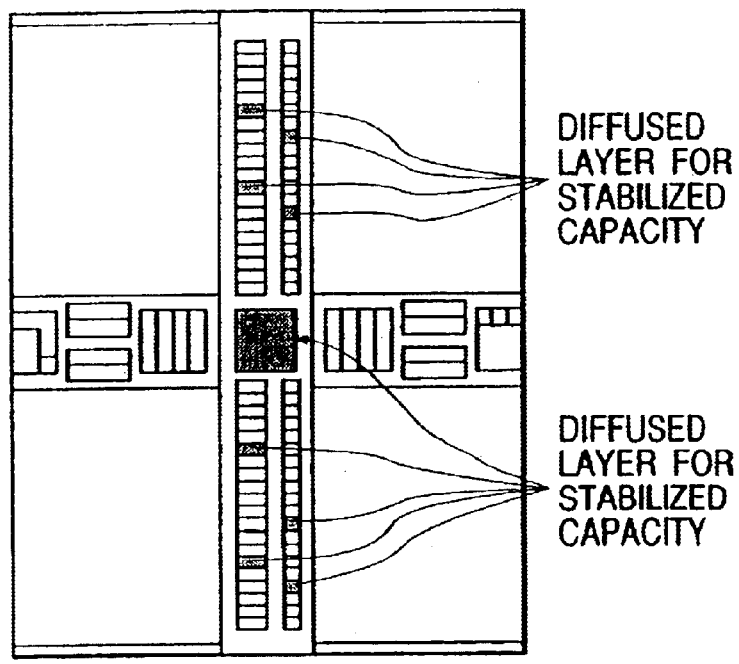
FIGS. 9A and 9B are respective diagrams schematically illustrating a configuration of another embodiment of a dynamic RAM to which the present invention is applied.
Figure 9B:
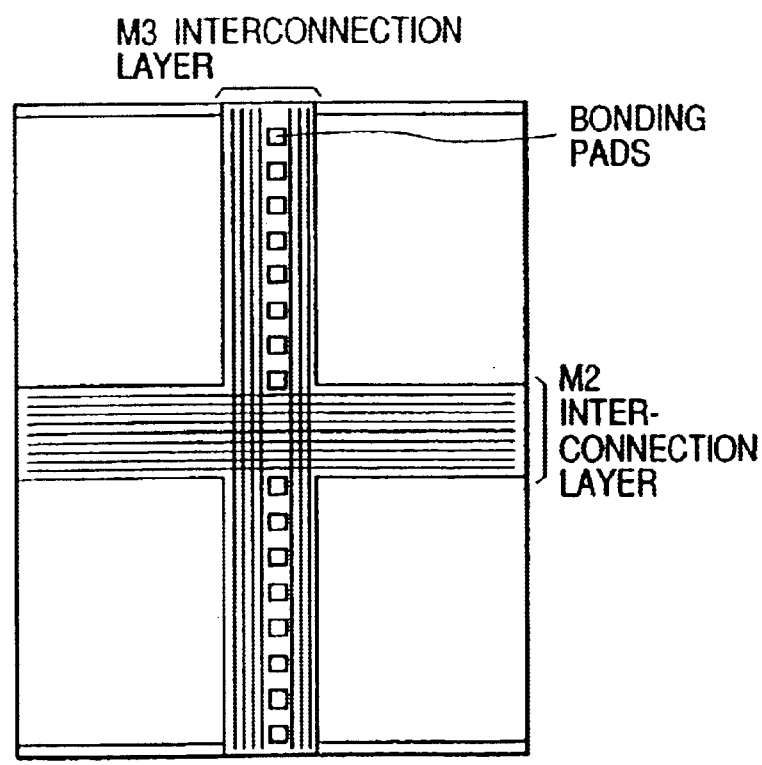

FIGS. 9A and 9B are diagrams schematically illustrating a configuration of another embodiment of a dynamic RAM to which the present invention is applied. In the drawings, a schematic layout of diffusion layers is shown in FIG. 9A, and a schematic layout of wiring layers is illustrated in FIG. 9B. In the layouts shown in the drawings, typical portions of respective circuit blocks constituting the dynamic RAM are illustrated so that their principal parts are understood. They are formed over a single semiconductor substrate, such as monocrystal silicon, by a known semiconductor integrated circuit manufacturing technology.

Even in the case of the present embodiment, a memory array is divided into four parts that are distributed from side to side with respect to the longitudinal direction of a semiconductor chip. Address input circuits and data input/output circuits are formed in a central portion extending in the longitudinal direction of the semiconductor chip as shown in FIG. 9A, whereas a bonding pad sequence and a wiring channel comprised of a wiring layer M3 corresponding to a third layer are formed as shown in FIG. 9B. The input/output interface circuit and power circuits including a booster circuit and a de-booster circuit, and the like are provided in the central portion extending in the longitudinal direction. Although the invention is not restricted in particular, each redundant circuit is provided in a transversely-extending central portion of the semiconductor chip as will be described later. A wiring channel comprised of a metal layer M2 corresponding to a second layer is formed in a portion where such a redundant circuit is formed.

In the present embodiment, a diffusion layer for forming a stabilized capacitance is formed in the central portion of the semiconductor chip, where the wiring channel corresponding to the third layer and the wiring channel corresponding to the second layer intersect. Although the invention is not restricted in particular, the stabilized capacitance is used as stabilized capacitance of each de-boosting power circuit for producing operating voltages for the peripheral circuits. The de-boosting power circuits are constructed as follows. As will be described later, a plurality of circuits are placed so as to be distributed to a portion where peripheral circuits lying in the longitudinally-extending central portion on the semiconductor chip are formed. Further stabilized capacitance or capacitors having small capacitance values are also connected by utilizing spatial semiconductor regions of the peripheral circuits. Since such distributedly-provided stabilized capacitance or capacitors make use of the semiconductor regions limited as described above, they are set to a small capacitance value as compared with the stabilized capacitance formed in the chip's central portion.

The peripheral circuits are formed in the relatively long and longitudinally-extending central portion on the semiconductor chip as described above. Owing to the placement of the plurality of de-boosting power circuits in distributed form as described above, the operating voltage can be stabilized because a current required upon operation of each peripheral circuit is supplied through each wiring route over a relatively short distance. Although the invention is not restricted in particular, the metal layer M3 corresponding to the third layer is used as a source line for supplying such a de-boosted voltage.

Although the invention is not restricted in particular, the peripheral circuits are placed so as to interpose the bonding pad sequence shown in FIG. 9B therebetween. As shown in FIG. 9A, the relatively large circuit cell sequence on the left side includes peripheral circuits such as an input circuit, a predecoder, a power circuit, etc., whereas the relatively small circuit cell sequence on the right side constitutes an output circuit. In the present embodiment, the peripheral circuits are placed with the bonding pad sequence interposed therebetween and the output circuit is spaced apart from other than the same. Namely, the output circuit is a circuit for amplifying a signal read from a main amplifier and outputting the amplified signal therefrom. Since the output circuit has a weak relationship to other circuits, the degree of integration is not reduced so far and the bonding pad sequence can approach the central side of the chip even if the output circuit is separated from the others. The construction wherein the bonding pad sequence is placed over the semiconductor chip so as to approach the center thereof, as described above, facilitates electrical connections of the bonding pad sequence with leads applied onto the chip by the LOC technology so as to interpose such a bonding pad sequence therebetween.

Figure 10:
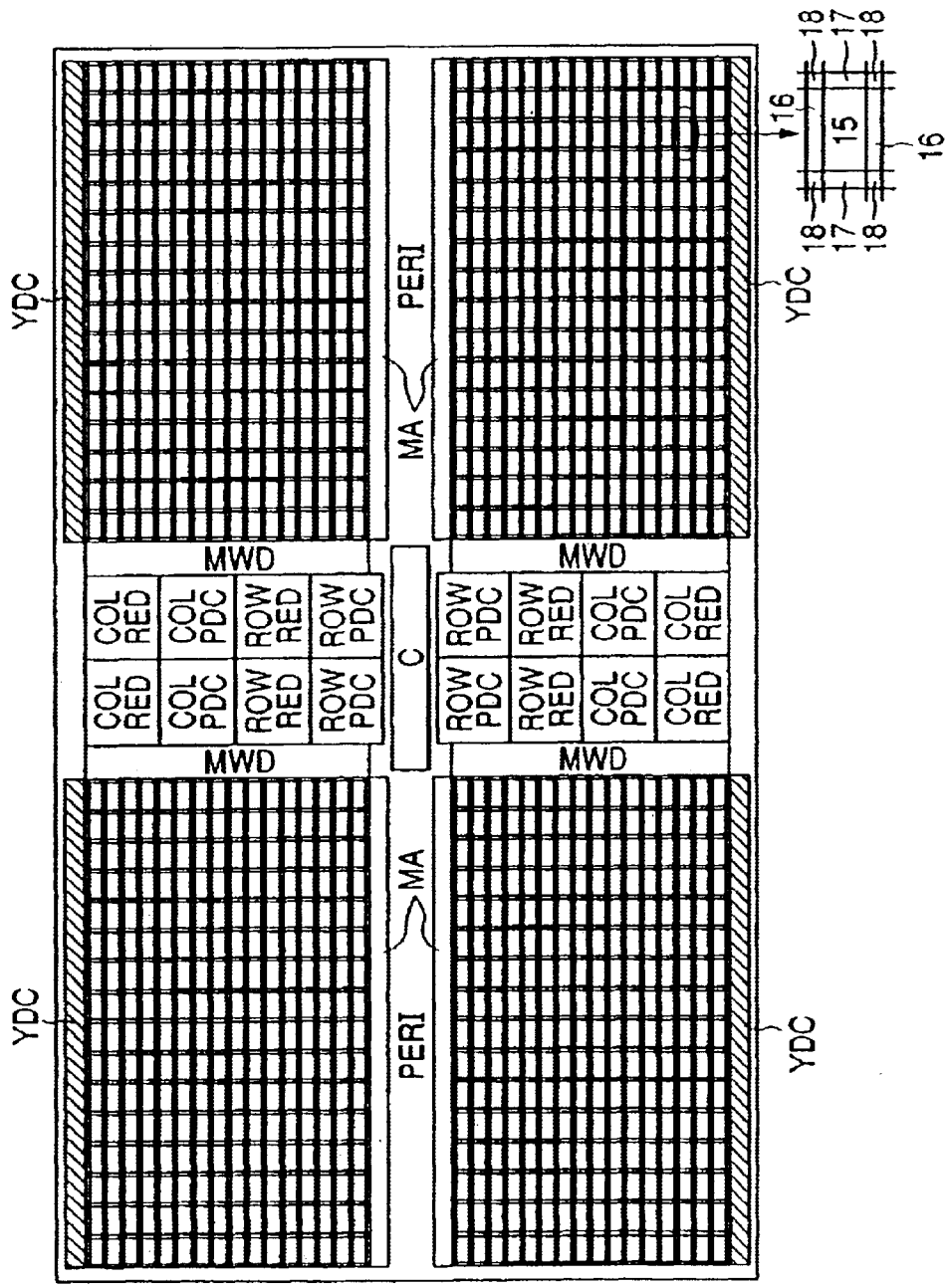
FIG. 10 is a schematic layout diagram depicting one embodiment of a dynamic RAM according to the present invention.

FIG. 10 is a schematic layout diagram showing one embodiment of a dynamic RAM according to the present invention. In the present embodiment, a memory array is divided into four parts as a whole in the same manner as described above. They are disposed two by two in upward and downward directions along the longitudinal direction of a semiconductor chip and two by two from side to side. Input/output interface circuits PERI each comprised of an address input circuit, a data input/output circuit and a bonding pad sequence, etc. are provided in a central portion extending along the longitudinal direction of the chip in the same manner as described above. Main amplifiers MA are respectively placed on the center sides of the memory arrays.

In the respective memory arrays, equal to four in total, which are disposed two by two in the upward and downward directions and two by two from side to side along the longitudinal direction of the semiconductor chip, as described above, X-system predecoder circuits ROWPDC and relief Circuits ROWRED, and Y-system predecoder circuits COLPDC and relief circuits COLRED, are collectively placed in an intermediate portion extending in a direction transverse to the longitudinal direction. Namely, the X-system predecoder circuits ROWPDC and relief circuits RWORED, and the Y-system predecoder circuits COLPDC and relief circuits COLRED, respectively associated with the four memory arrays, are provided in part as two pairs in association with the memory arrays provided two by two from side to side.

Main word driver areas MWD are formed along the intermediate portions of the memory arrays in the same manner as described above so as to respectively drive main word lines provided so-as to extend toward the lower and upper sides in association with the respective memory arrays. In the present construction, the main word lines are extended so as to penetrate a plurality of sub-arrays when sub-arrays similar to the above are used. In the memory arrays, Y decoders YDC are respectively provided on the chip peripheral sides opposite to the chip central portion. Namely, in the present embodiment, the respective memory arrays divided by the main amplifiers MA placed on the central side and the Y decoders YDC placed on the peripheral sides are disposed so that they are interposed therebetween. In this case, a portion, where longitudinally and transversely extending wiring channels intersect, is formed in the central portion of the chip as described above, and a stabilized capacitor C is formed thereat. Further, stabilized capacitance or capacitors each having a small capacitance value are suitably provided even within clearances of peripheral circuits or the like in distributed form.

Although the invention is not restricted in particular, the Y decoders YDC are respectively provided on the chip peripheral sides opposite to the chip central portion in the memory arrays. In the present embodiment, the respective memory arrays divided by the main amplifiers MA placed on the central side and the Y decoders YDC placed on the peripheral sides are respectively disposed so as to be interposed therebetween. As one of the memory arrays is illustrated in a 4 enlarged form, each of the individual memory arrays is divided into a plurality of sub-arrays 15. Each sub-array 15 is formed so as to be surrounded by sense amplifier areas 16 and sub-word driver areas 17 placed so as to interpose the sub-array 15 therebetween. Portions where the sense amplifier areas 16 and the sub-word driver areas 17 intersect are respectively defined as intersecting areas 18. Sense amplifiers provided in the sense amplifier areas 16 are configured based on a shared sense system. Except for sense amplifiers placed at both ends of the memory cell arrays, complementary bit lines are provided on both sides with each sense amplifier at the center. The sense amplifiers provided in each sense amplifier area 16 are selectively connected to the complementary bit lines of either one of the memory cell arrays placed on both sides.

One sub-array 15 comprises, for example, 256 sub-word lines and 256 pairs of complementary bit lines (or data lines) respectively orthogonal to the sub-word lines, although not shown in the drawing. Incidentally, each sub-array is also provided with spare word lines for replacing or repairing defective word lines or defective bit lines, and spare complementary bit lines. Since sixteen sub-arrays are provided in a word-line arrangement direction in one memory array referred to above, 4K sub-word lines are provided as a whole. Further, since sixteen sub-arrays are provided in a bit-line arrangement direction, 4K complementary bit lines are provided as a whole. Since four memory arrays are provided four as a whole, a storage capacity of 4×4K×4K= 64 Mbits is provided as a whole. Thus, the complementary bit lines are respectively divided into lengths of $\frac{1}{16}$ in association with the sixteen sub-arrays. Sub-word lines are respectively divided into lengths of $\frac{1}{16}$ in association with the sixteen sub-arrays.

Sub-word drivers (sub-word line driver circuits) 17 are provided for all divided sub-arrays 15 in one memory array. The sub-word drivers 17 are respectively divided into lengths of $\frac{1}{16}$ with respect to the main word line as described above and form or produce signals for selecting the sub-word lines extending in parallel therewith. In the present embodiment, the four sub-word lines are placed for each main word line so as to extend in a complementary bit-line direction, although the invention is not restricted in particular, in order to reduce the number of main word lines, in other words, to expand the wiring pitch of each main word line. In order to select one sub-word line from the sub-word lines divided into eight in a main word-line direction and assigned four by four in the complementary bit-line direction, an unillustrated sub-word selection driver is placed in each main word driver MWD. The sub-word selection driver produces a signal for selecting one from the four sub-word selection lines extending in the direction in which the sub-word drivers are arranged.

When a Y address is inputted upon adoption of the layout shown in FIG. 10, it is transmitted via an address buffer ADDBUP to the corresponding Y decoder YDC placed on the chip peripheral side through the relief circuit and predecoder provided at the intermediate portion of each memory array, where a Y select signal is produced. The complementary bit line pair of one sub-array is selected according to the Y select signal and hence the Y select signal is transferred to its corresponding main amplifier MA on the chip central side opposite thereto, where it is amplified and outputted through an unillustrated output circuit.

It is apparently determined from this construction that the time required from the routing of a signal through a chip to the output of a read signal becomes long. However, it is necessary to input an address signal to the relief circuit as it is. Thus, when the relief circuit is placed in any location at the center of the chip, the time required for the predecoder to produce an output is determined, while the result of a decision as to whether the corresponding address is defective is kept waiting. Namely, when the predecoder and the relief circuit are spaced from each other, a signal delay thereat could lead to a delay in an actual Y select operation.

Since the main amplifier MA and the Y decoder YDC are disposed on both sides of each memory array with the memory array interposed therebetween in the present embodiment, the sum of a signal transfer route for selecting a complementary bit line pair of each sub-array and a signal transfer route leading to the input of each main amplifier MA through an input/output line from the selected complementary bit line pair results in a signal transfer route simply crossing each memory array even if an attempt is made to select any complementary bit line pair, whereby the signal transfer route can be reduced to half the one round trip as described above. It is thus possible to speed up memory access.

Figure 11:
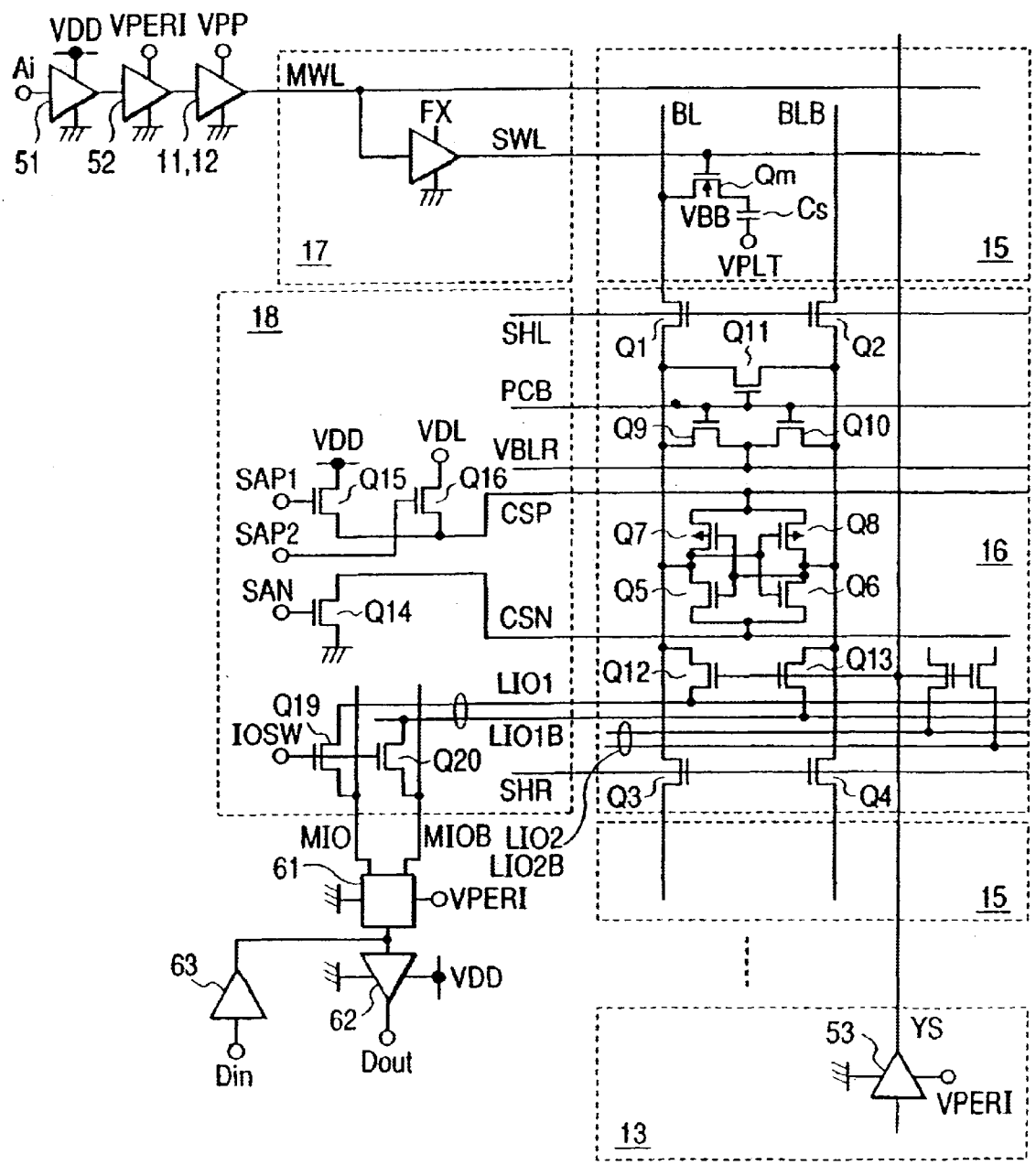
FIG. 11 is a circuit diagram showing one simplified embodiment including a configuration from an address input to a data output with a sense amplifier section of a dynamic RAM according to the present invention at the center.

FIG. 11 is a circuit diagram showing one simplified embodiment including the circuit configuration from an address input to a data output, with a sense amplifier section of a dynamic RAM according to the present invention at the center. In the drawing, a sense amplifier 16 interposed between two sub-arrays 15 located above and below, and a circuit provided in an intersecting area 18, are shown by way of illustrative example, and others are shown as block diagrams.

One dynamic memory cell provided between a sub-word line SWL provided in one sub-array 15 referred to above and one line BL of the complementary bit lines BL and BLB is shown by way of illustrative example as a typical one. The dynamic memory cell comprises an address selection MOSFET Qm and a storage capacitor Cs. The gate of the address selection MOSFET Qm is electrically connected to its corresponding sub-word line SWL, the drain thereof is electrically connected to its Corresponding bit line BL, and the source thereof is electrically connected with the storage capacitor Cs. The other electrode of the storage capacitor Cs is used in common and is supplied with a plate voltage VPLT. A negative back bias voltage VBB is applied to a substrate (channel) of the MOSFET Qm. Although the invention is not restricted in particular, the back bias voltage VBB is set to a voltage like −1V. The level for selecting the sub-word line SWL is set to a high voltage VPP increased by a threshold voltage of the address selection MOSFET Qm from a high level on the bit line.

When the sense amplifier is activated by an internal de-boosted voltage VDL, a high level amplified by the sense amplifier and supplied to the corresponding bit line is set to the internal voltage VDL level. Accordingly, the high voltage VPP corresponding to the selected level of the word line is set to VDL+Vth+α. The pair of complementary bit lines BL and BLB provided on the left side of the sense amplifier are disposed in parallel as shown in the drawing. The complementary bit lines BL and BLB are electrically connected to their corresponding input/output nodes of a unit circuit of the sense amplifier by shared switches MOSFETs Q1 and Q2.

The unit circuit of the sense amplifier comprises a CMOS latch circuit comprised of N channel type amplifying MOSFETs Q5 and Q6 and P channel type amplifying MOSFETs Q7 and Q8 whose respective gates and drains are cross-connected to one another so that they are brought into latch form. The sources of the n channel type MOSFETs Q5 and Q6 are respectively electrically connected to a common source line CSN. The sources of the P channel type MOSFETs Q7 and Q8 are respectively electrically connected to a common source line CSP. Power switch MOSFETs are respectively electrically connected to the common source lines CSN and CSP. Although the invention is not restricted in particular, the common source line CSN electrically connected to the sources of the N channel type amplifying MOSFETs Q5 and Q6 is supplied with an operating voltage corresponding to a ground potential by an N channel type power switch MOSFETs Q14 provided in the cross area 18.

An over driving N channel type power MOSFET Q16 provided in the cross area 18 and an N channel type power MOSFET Q15 for supplying the internal voltage VDL are provided so as to be electrically connected to the common source line CSP to which the sources of the P channel type amplifying MOSFETs Q7 and Q8 are electrically connected. A source voltage VDD supplied from an external terminal is used as a voltage for the overdriving MOSFET, although the invention is not restricted in particular. Alternatively, in order to reduce the dependency of the sense amplifier operating velocity on the source voltage VDD, the voltage may be slightly de-boosted or reduced so as to be obtained from the source of the N channel type MOSFET whose gate is supplied with VPP and whose drain is supplied with the source voltage VDD. A sense amplifier overdriving activation signal SAP1 supplied to the gate of the N channel type power MOSFET Q15 is defined as a signal in phase with an activation signal SAP2 supplied to the gate of the N channel type MOSFET Q16. The signals SAP1 and SAP2 are respectively brought to a high level on a time-sequence basis. Although the invention is not restricted in particular, the high levels of SAPI and SAP2 are respectively defined as a signal having a boosted voltage VPP level. Namely, since the boosted voltage VPP is about 3.6V, the N channel type MOSFETs Q15 and Q16 can be brought to an on state sufficiently. After the MOSFET Q15 is brought to an off state (the signal SAP1 is low in level), the MOSFET Q16 is turned on (the signal SAP2 is high in level) so that the voltage corresponding to the internal voltage VDL can be outputted from the source side thereof.

A precharge (equalize) circuit comprised of an equalize MOSFET Q11 for short-circuiting the complementary bit lines and switch MOSFETs Q9 and Q10 for supplying a half precharge voltage VBLR to the complementary bit lines is provided at the input/output nodes of the unit circuit of the sense amplifier. The gates of these MOSFETs Q9 through Q11 are supplied with a precharge signal PCB in common. With respect to a driver circuit for producing the precharge signal PCB, an inverter circuit is provided in the cross area to make the falling or rising edge of the precharge signal fast, although this is not shown in the drawing. In other words, prior to the timing for selecting the corresponding word line upon the start of a memory access, each of the MOSFETs Q9 through Q11 constituting the precharge circuit is selected at a high speed through each of the inverter circuits provided in distributed form in the respective cross areas.

An IO switch circuit IOSW (switch MOSFETs Q19 and Q20 for connecting a local IO and a main IO to each other) is placed in the cross area 18. Further, the cross area 18 also includes a half precharge circuit used for each of the common source lines CSP and CSN for each sense amplifier, a half precharge circuit for each local input/output line LIO, a VDL precharge circuit for each main input/output line, a dispersive driver circuit for each of the shared select signal lines SHR and SHL, etc. except for the circuits shown in FIG. 3 as needed.

The unit circuit of the sense amplifier is electrically connected to similar complementary bit lines BL and BLB of the sub-array 15, provided on the lower side in the drawing through shared switch MOSFETs Q3 and Q4. When, for example, the corresponding sub-word line SWL of the sub-array 15 on the upper side is selected, the shared switch MOSFETs Q1 and Q2 on the upper side of the sense amplifier are held on and the shared switch MOSFETs Q3 and Q4 on the lower side thereof are turned off. Switch MOSFETs Q12 and Q13 constitute a column (Y)switch circuit. When the select signal YS is set from a YS driver 53 in a column decoder circuit 13 to a select level (high level), the MOSFETs Q12 and Q13 are turned on so that the input/output nodes of the unit circuit of the sense amplifier and local input/output lines LI01, LI01B, LI02, LI02B, etc. are electrically connected to one another.

Thus, the input/output nodes of the sense amplifier are electrically connected to the complementary bit lines BL and BLB on the upper side so that a small signal of the memory cell electrically connected to the selected sub-word line SWL is amplified. Thereafter, the amplified signal is transmitted to the local input/output lines LI01 and LIOIB through the column switch circuit (Q12 and Q13). The local input/output lines LI01 and LI01B are extended along the sense amplifier sequence, i.e., in the transverse direction in the drawing. The local input/output lines LIO1 and LIO1B are electrically connected to the main input/output lines MIO and MIOB connected to an input terminal of a main amplifier 61 through an IO switch circuit comprised of N channel type MOSFETs Q19 and Q20 provided in the cross area 18.

The IO switch circuit is switch-controlled by a select signal formed by decoding an X-system address signal. Incidentally, the IO switch circuit may take a CMOS switch configuration wherein P channel type MOSFETs are electrically connected in parallel with the N channel type MOSFETs Q19 and Q20 respectively. In a burst mode of a synchronous DRAM the column select signal YS is changed over according to a counter operation to successively perform switching between electrical connections between the local input/output lines LIO1, LIO1B and LI02, LI02B and the complementary bit lines BL and BLB of the sub-array, which are provided as two pairs.

An address signal Ai is supplied to an address buffer 51. The address buffer 51 is activated on a time-shared basis to take in an X address signal and a Y address signal. The X address signal is supplied to a predecoder 52 so that a select signal for a main word line MWL is formed through a main row decoder 11 and a main word driver 12. Since the address buffer 51 receives the address signal Ai supplied from an external terminal therein, it is activated based on the source voltage VDD supplied from the external terminal. The predecoder 52 is activated based on the de-boosted voltage VPERI, and the main word driver 12 is activated based on the boosted voltage VPP. A logic circuit to be described later having a level converting function, which receives the predecoded signal therein, is used as the main word driver 12. A column decoder (driver) 53 receives a Y address signal supplied according to the time-shared operation of the address buffer 51 therein to thereby form the select signal YS.

The main amplifier 61 is activated based on the de-boosted voltage VPERI. Thus, the output of the main amplifier 61 is outputted from an external terminal Dout through an output buffer 62 activated based on the source voltage VDD supplied from the external terminal. A write signal inputted from an external terminal Din is captured through an input buffer 63. Further, the write signal is supplied to the main input/output lines MIO and MIOB through a write amplifier (write driver) included in the main amplifier 61. A level shift circuit and a logic unit for synchronizing a signal outputted from the level shift circuit with a timing signal corresponding to the clock signal and outputting the synchronized signal therefrom are provided at the input of the output buffer 62.

Although the invention is not restricted in particular, the source voltage VDD supplied from the external terminal is set to 3.3V in a first form, the de-boosted voltage VPERI supplied to the internal circuit is set to 2.5V, and the operating voltage VDL of the sense amplifier is set to 2.0V, respectively. Further, the word-line select signal (boosted voltage) is set to 3.6V. A precharge voltage VBLR for each bit line is set to 1.0V corresponding to VDL/2 and a plate voltage VPLT is also set to 1.0V. Further, a substrate voltage VBB is set to -1.0V. The source voltage VDD supplied from the external terminal may be set to a low voltage like 2.5V. When such a low source voltage VDD is taken, the de-boosted voltage VPERI is set to 2.0V and the de-boosted voltage VDL is set to a lower voltage of about 1.8V.

In the present embodiment, the predecoder 52 for receiving the output signal of the address buffer 51 consists of a circuit block operated on the basis of the source voltage VDD and the internal de-boosted voltage VPERI and is constructed by a combination of the two-power operated cell and the multi-power operated cell shown in FIG. 4. Alternatively, the main amplifier 61 is also provided with a level converting or shift circuit for converting a signal of a VDL level to a VPERI level. Further, the output buffer 62 is provided with a level shift circuit for converting a VPERI level to a VDD level. A circuit block comprised of a combination of the two-power operated cell and the multi-power operated cell in the same manner as described above is used therein.

Figure 12:
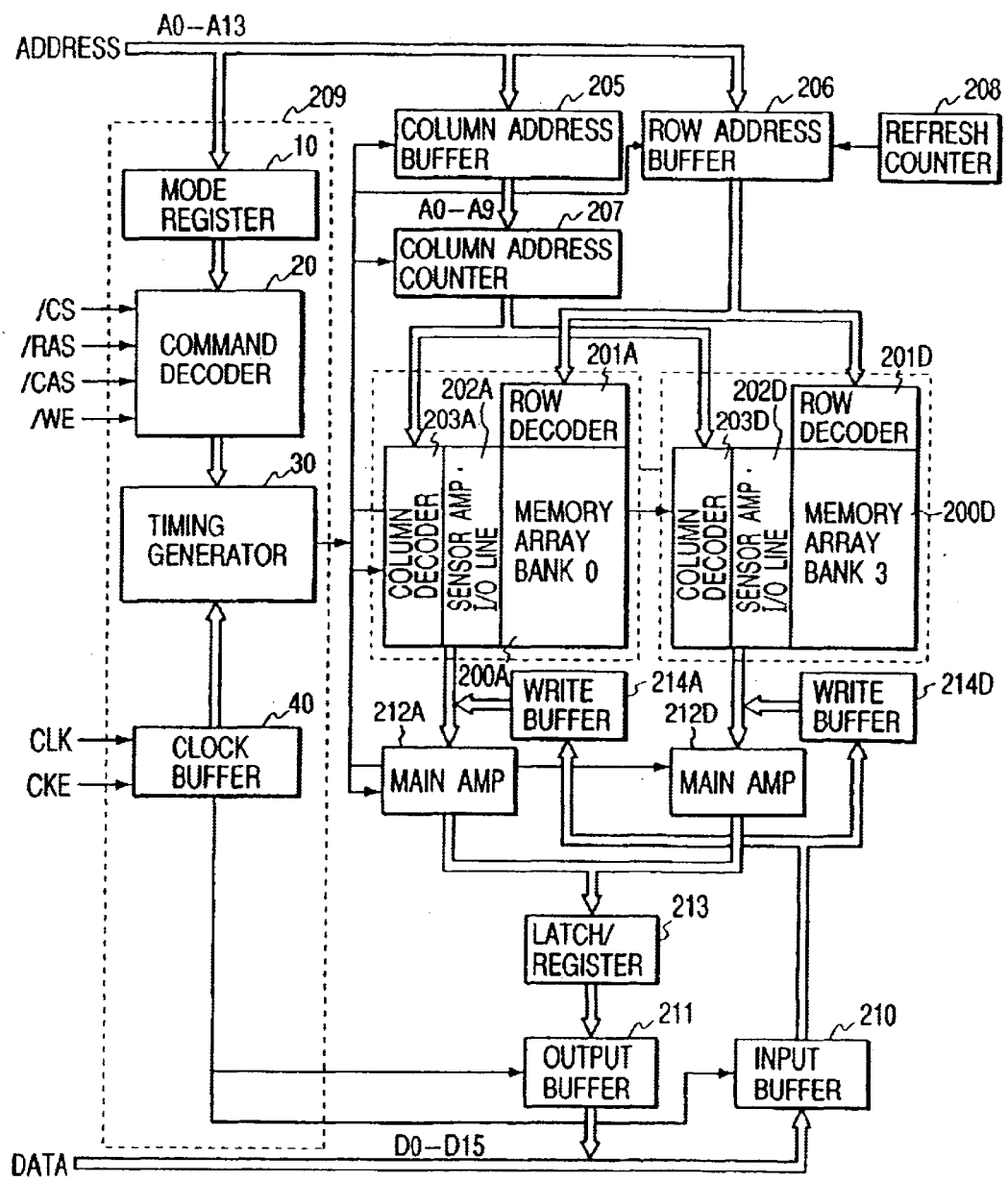
FIG. 12 is an overall block diagram illustrating one embodiment of an SDRAM to which the present invention is applied.

FIG. 12 is an overall block diagram showing one embodiment of a synchronous DRAM (hereinafter called simply "SDRAM") of about 64 Mbits, to which the present invention is applied. In the SDRAM according to the present embodiment, although the invention is not restricted in particular, a memory array 200A constituting the memory bank 0 of the four memory banks shown in FIG. 1 and a memory array 200D constituting the memory bank 3 thereof are illustratively shown. Namely, memory arrays corresponding to the two memory banks 1 and 2 of the four memory banks are omitted. The memory arrays 200A through 200D respectively corresponding to the four memory banks 0 through 3 are respectively provided with dynamic memory cells arranged in matrix form as in the case of the memory arrays 200A and 200D illustratively shown in the same drawing. According to the drawing, selection terminals of memory cells placed in the same column are electrically connected to their corresponding word lines (not shown) placed in all columns, and data input/output terminals of memory cells placed in the same row are electrically connected to their corresponding complementary data lines (not shown) in all columns.

One of the unillustrated word lines of the memory array 200A is driven to a select level according to the result of decoding of a row address signal by a row decoder 201A. The unillustrated complementary data lines of the memory array 200A are electrically connected to an I/O line 202A including a sense amplifier and a column selection circuit.

The sense amplifier in the I/O line 202A including the sense amplifier and the column selection circuit is an amplifier circuit for detecting a small potential difference developed in each complementary data line according to the reading of data from each memory cell and amplifying it. The column switch circuit in the I/O line 202A is a switch circuit for individually selecting the complementary data lines and providing continuity between the selected complementary data line and complementary I/O lines. The column switch circuit is selectively operated according to the result of decoding of a column address signal by a column decoder 203A.

In a manner similar to the memory array 200D as well, a row decoder, an I/O line including a sense amplifier and a column selection circuit, and a column decoder are provided as illustratively shown by the memory array 200D. The complementary I/O lines are electrically connected to output terminals of write buffers 214A and 214D and input terminals of main amplifiers 212A and 212D. Signals outputted from the main amplifiers 212A and 212D are transferred to an input terminal of a latch/register 213. A signal outputted from the latch/register 213 is outputted from an external terminal through an output buffer 211. A write signal inputted from the external terminal is transferred to input terminals of the write buffers 214A and 214D through an input buffer 210. Although the invention is not restricted in particular, the external terminal serves as a data input/output terminal for outputting data D0-D15 comprised of 16 bits. Incidentally, main amplifiers and write buffers similar to the above are provided so as to correspond to the omitted memory arrays respectively.

Address signals A0 through A13 supplied from address input terminals are brought into a column address buffer 205 and a row address buffer 206 in address multiplex form. The supplied address signals are held by their corresponding buffers. The row address buffer 206 takes in or captures a refresh address signal outputted from a refresh counter 208 as a row address signal in a refresh operation mode. The output of the column address buffer 205 is supplied to a column address counter 207 as preset data therefor. The column address counter 207 outputs values obtained by successively incrementing a column address signal, defined as the preset data or its column address signal according to an operation mode specified by a command to be described later, to the column decoders 203A through 203D.

Although the invention is not restricted in particular, a controller 209 indicated by a dotted line in the drawing is supplied with external control signals such as a clock signal CLK, a clock enable signal CKE, a chip select signal /CS, a column address strobe signal /CAS ((symbol / means that a signal provided with / is a row enable signal), a row address strobe signal /RAS and a write enable signal /WE, etc., and control data inputted from the address input terminals AO through A11 and forms or produces internal timing signals for controlling operation modes of the SDRAM and the operations of the circuit blocks, based on changes in the levels of these signals, the timing and the like. Further, the controller 209 includes a mode register 10, a command decoder 20, a timing generator 30 and a clock buffer 40, etc.

The clock signal CLK is inputted to a clock synchronous Circuit (not shown) through the clock buffer 40, where an internal clock is generated. Although the invention is not restricted in particular, the internal clock is used as a timing signal for activating the output buffer 211 and the input buffer 210 and is supplied to the timing generator 30, where timing signals supplied to the column address buffer 205, row address buffer 206 and column address counter 207 are produced based on the clock signal.

Other external input signals are rendered significant in synchronism with the leading edge of the internal clock signal. The chip select signal /CS provides instructions for starting a command input cycle, based on its low level. The transition of the chip select signal /CS to a high level (chip non-selected state) and other inputs do not make sense. However, the state of selection of each memory bank and the internal operations such as a burst operation, etc. to be described later are not affected by the transition of the signal to the chip non-selected state. The respective signals /RAS /CAS and /WE differ in function from corresponding signals employed in the normal DRAM but serve as significant signals when a command cycle to be described later is defined.

The clock enable signal CKE is a signal for providing instructions for validity of the following clock signal. If the clock enable signal CKE is of a high level, then the rising edge of the next clock signal CLK is made effective. If the clock enable signal CKE is low in level, then the rising edge thereof is made ineffective. When an external control signal /OE for performing the control of output enable on the output buffer 211 in an read mode is provided, such a signal /OE is also supplied to the controller 209. When the external control signal /OE is high in level, for example, the output buffer 211 is brought to a high output impedance state.

The row address signals are respectively defined by A0 to A11 levels in a row address strobe/bank active command cycle to be described later synchronized with the rising edge of the clock signal CLK (internal clock signal).

The address signals A12 and A13 are regarded as bank select signals in the row address strobe/bank active command cycle. Namely, one of the four memory banks 0 through 3 is selected according to the combination of A12 and A13. Although the invention is not restricted in particular, the control on the selection of the memory bank can be performed by processes such as the activation of only the row decoder on the selected memory bank side, all the non-selection of the column switch circuits on the non-selected memory bank side, connections to the input buffer 210 and the output buffer 211 on the selected memory bank side alone, etc.

The column address signals are defined by A0 through A9 levels in a read or write command (corresponding to a column address/read command or a column address/write command to be described later) cycle synchronized with the rising edge of the clock signal CLK (internal clock). Each column address defined in this way is set as a start address for burst access.

Principal operation modes of the SDRAM, which are to be instructed by commands, will next be described.

(1) Mode Register Set Command (Mo)

This is a command for setting the mode register 30, which is specified by /CS, /RAS, /CAS and /WE=low level. Data (register set data) to be set is given through each of A0 through A11. Although the invention is not restricted in particular, the register set data may be defined as a burst length, a CAS latency, a write mode, etc. Although the invention is not restricted in particular, the settable burst length may be defined as 1, 2, 4, 8 and a full page, the settable CAS latency may be defined as 1, 2 and 3, and the settable write mode may be defined as burst write and single write, respectively.

The CAS latency indicates what cycles of internal clock signal are wasted from the falling edge of the /CAS to the output operation of the output buffer 211 upon a read operation specified by a column address/read command to be described later. An internal operation time for the reading of data is required until the read data is established or determined. Therefore, the CAS latency is used to set the internal operation time according to the frequency of the internal clock signal. In other words, when an internal clock signal having a high frequency is used, the CAS latency is set to a relatively large value. On the other hand, when an internal clock signal having a low frequency is used, the CAS latency is set to a relatively small value.

(2) Row Address Strobe/bank Active Command (Ac)

This is a command for providing instructions for a row address strobe and for making the selection of each memory bank based on A12 and A13 effective. This command is specified by /CS and /RAS=low level and /CAS and /WE= high level. At this time, addresses supplied to AO through A9 are captured as row address signals, and signals supplied to A12 and A13 are captured as select signals for the memory banks. Their capturing operations are performed in synchronism with the rising edge of the internal clock signal as mentioned above. When the corresponding command is designated or specified, for example, a word line in a memory bank specified by the command is selected. Thus, memory cells connected to the corresponding word line and their corresponding complementary data lines are brought into conduction.

(3) Column Address/read Command (Re)

This is a command required to start a burst read operation. Further, it is also a command for providing instructions for a column address strobe. This command is specified according to /CS and /CAS=low level and /RAS and /WE=high level. At this time, column addresses supplied to AO through A7 (X 16-bit configuration) are captured as column address signals respectively. Thus, the captured column address signals are supplied to the column address counter 207 as burst start addresses. Prior to the burst read operation specified thereby, a memory bank and a word line lying therein have been selected in the row address strobe/bank active command cycle. Upon the start of a burst read operation in this condition, the memory cells connected to the selected word line are successively selected in accordance with each address signal outputted from the column address counter 207 in synchronism with the internal clock signal and their items of data are sequentially read therefrom. The number of the sequentially-read data is set as a number specified by the burst length. The output buffer 211 starts reading data while waiting for the number of cycles in the internal clock signal defined by the CAS latency.

(4) Column Address/write Command (Wr)

When the burst write is set to the mode register 10 as a write operation mode, this command is defined as a command required to start the corresponding burst write operation. When the single write is set to the mode register 10 as a write operation mode, this command is defined as a command required to start the corresponding signal write operation. Further, the corresponding command provides instructions for column address strobes at the signal write and the burst write. The command is specified by /CS, /CAS and /WE=low level and /RAS high level. At this time, the addresses supplied to A0 through A9 are captured as column address signals. Thus, the captured column address signals are supplied to the column address counter 207 as burst start addresses upon the start of a burst write operation. A procedure for the burst write operation specified thereby is also performed in a manner similar to the burst read operation. However, no CAS latency is provided for the write operation and the capturing of the write data is started from the corresponding column address/write command cycle.

(5) Precharge Command (Pr)

This is defined as a command for starting a precharge operation to be effected on a memory bank selected by A12 and A13. This command is specified by /CS, /RAS and /WE=low level and /CAS=high level.

(6) Autorefresh Command

This is a command required to start autorefresh and is specified by /CS, /RAS and /CAS=low level and /WE and CKE high level.

(7) Burst Stop/in/full Page Command

This is a command required to stop all the memory banks from a burst operation for a full page. This command is ignored in burst operations other than that for a full page. This command is specified by /CS and /WE low level and /RAS and /CAS=high level.

(8) No-operation Command (Nop)

This is a command for indicating the non-execution of a substantial operation, which is specified by /CS=low level and /RAS, /CAS and /WE=high level.

When another memory bank is specified in the course of a burst operation and the row address strobe/bank active command is supplied while the burst operation is being performed in one memory bank in the SDRAM, no influence is imposed on the operation at one memory bank under the corresponding execution and the operation of a row address system in another memory bank is enabled. For example, the SDRAM has means for holding therein data, addresses and control signals supplied from the outside. Although the invention is not restricted in particular, the held contents thereof, particularly, the addresses and control signals are held for all memory banks. Alternatively, data corresponding to one word line in the memory block selected according to the row address strobe/bank active command cycle is to be held in the latch/register 213 for purposes of the read operation in advance before the column-system operation.

Thus, while a non-processed command is being executed, the precharge command and the row address strobe/bank active command for a memory bank different from the memory banks to be processed by the command under execution are issued unless data D0 through D15 comprised of 16 bits collide with each other at a data input/output terminal to thereby make it possible to start an internal operation in advance. The SDRAM according to the present embodiment performs a memory access in 16-bit units as described above, has addresses corresponding to about 1M owing to the addresses AO through A11, and is constructed of four memory banks. Therefore, the SDRAM has a storage capacity of about 64 Mbits (1M×4 banks×16 bits) as a whole.

Operations and effects obtained from the embodiment are as follows.

(1) An advantageous effect can be obtained in that a plurality of unit regions or areas in which one or plural MOSFETs for implementing specific logic circuits are formed, are placed in a first direction, a first interconnection extending in the first direction is formed over the unit areas, a second interconnection extending in the first direction is formed along the unit areas and outside the unit areas, and wiring dedicated areas each provided with a third interconnection extending in a second direction orthogonal to the first direction are respectively provided between the adjacent unit areas, and a logic circuit formed in each unit area is constructed so as to have both a first connection form connected to the first interconnection and a second connection form connected to the third interconnection through the second interconnection according to a combination with each wiring dedicated area adjacent to each other as needed, whereby an input signal region is ensured regardless of the layout of each cell, thereby making it possible to greatly reduce non-connections or non-wire bonding even with wiring design using automatic wiring technology.

(2) Another advantageous effect can be obtained in that the wiring dedicated areas are provided in a one-to-one correspondence with the unit areas and are used in the logic circuits formed in the unit areas corresponding to the wiring dedicated areas when the second connection form is needed, whereby input signal regions are ensured for all the cells regardless of the layout of the cells, thereby making it possible to prevent non-connections even upon wiring design using the automatic wiring technology and provide connections between all the signal lines automatic wiring technology.

(3) A further advantageous effect can be obtained in that the third interconnection is formed in the same process as that for interconnections for electrically connecting between a plurality of MOSFETs for implementing the logic circuit within each unit area, whereby a multilayer interconnection can be utilized with efficiency.

(4) A still further advantageous effect can be obtained in that signal lines extending in a first direction are respectively formed in central portions of unit areas placed, in plural form in the first direction, source lines extending in the first direction are provided on both sides on the unit areas, the source lines are respectively formed so as to have each of the individual wiring widths on the unit areas corresponding to logic circuits operated by first and second voltages, and the first wiring widths are respectively divided by the source lines for supplying the first or second voltage, the source lines for supplying a third voltage and wiring intervals between the source lines on the unit areas corresponding to logic circuits operated by the third voltage different from the first and second voltages, whereby the heights of cells and the widths of the source lines as a whole can be unified regardless of the numbers of sources or power supplies in the cells and the type of power supply to thereby facilitate the layout of the cells, thus making it possible to provide high integration.

(5) A still further advantageous effect can be obtained in that signal lines extending in a first direction are respectively formed in central portions on unit areas placed in plural form in the first direction, source lines formed on both sides on the unit areas and extending in the first direction are formed, one or plural MOSFETs for implementing specific logical functions are formed in the unit areas, ends of semiconductor areas for sources and drains, which constitute the MOSFETS, are respectively formed so as to approach ends of the unit areas, whereby the signal lines extending in the first direction can be used in the central portions of the unit areas with efficiency while a speeding up of the operation is being achieved.

(6) A still further advantageous effect can be obtained in that the signal lines and the source lines are formed of a metal wiring layer corresponding to a second layer, and signal lines connected to the gates, sources and drains of the MOSFETs are made up of a metal wiring layer corresponding to a first layer, whereby a multilayer interconnection can be rationally used.

(7) A still further advantageous effect can be obtained in that a first signal line extending in a first direction is formed in central portions on unit areas placed in plural form in the first direction, ends of unit areas corresponding to first or second source lines of a first cell group formed on both sides on the unit areas placed in plural form in the first direction and provided with the first and second source lines extending in the first direction and a second cell group similar to the first cell group are placed back to back so as to adjoin each other to thereby form the first or second source lines as one source line, and each of contacts provided in association with the, source lines is aligned with the pitch as a reference, of each unit area, whereby high integration is allowed.

(8) A still further advantageous effect can be obtained in that unit areas arranged in plural form in a first direction, a first interconnection, which is formed over the unit areas and extends in the first direction, and a second interconnection formed along the unit areas and outside the unit areas, and extending in the first direction, are provided, and one or plural MOSFETs for implementing specific logic circuits are formed in the unit areas and those of the MOSFETS, of a type wherein their drain regions are placed side by side in plural form in the first direction and connected in parallel form to thereby constitute one MOSFET, are provided so as to have a plurality of interconnections by which the respective drain regions are connected to the second interconnection, whereby the resistance of each output interconnection can be reduced.

(9) An advantageous effect can be obtained in that the first interconnection and the second interconnection are formed of a metal wiring layer corresponding to a second layer, and the interconnections for connecting the drains of the MOSFETs and the second interconnection are comprised of a metal wiring layer corresponding to a first layer, whereby a multilayer interconnection can be rationally utilized together with the reduction in the resistance referred to above, and high integration is allowed.

(10) A still further advantageous effect can be obtained in that a first signal line is formed in central portions on unit areas placed in plural form in a first direction and extending in the first direction, unit circuits are formed which are provided with first and second source lines extending in the first direction and provided on both sides on the unit areas, circuit blocks are constructed wherein a plurality of the unit circuits are placed side by side in a second direction, each of the individual pairs of third and fourth source lines for supplying first and second voltages corresponding to the first and second source lines are respectively provided on both sides of each circuit block as viewed in the second direction so as to extend in the second direction, and the third and fourth source lines provided in each pair are respectively connected to one another by the first and second source lines of the unit circuits, whereby source impedance can be reduced by the minimum interconnection.

(11) A still further advantageous effect can be obtained in that the circuit blocks are placed in a central portion extending in a first direction, of a semiconductor chip along a plurality of bonding pad sequences placed side by side in the second direction, and memory arrays having the same storage construction are provided on both sides of the semiconductor chip and placed so as to interpose the circuit blocks and the bonding pads therebetween, whereby a semiconductor memory device, which minimizes a signal transfer route and achieves high integration, can be obtained.

(12) A still further advantageous effect can be obtained in that a redundant circuit for relieving a failure in each memory array is formed in a central portion extending in the second direction, of the semiconductor chip, and the memory arrays are constructed so as to be divided into four arrays by the circuit blocks, the bonding pad sequences and the redundant circuit, whereby the respective circuit blocks can be placed over the semiconductor chip with efficiency.

(13) A still further advantageous effect can be obtained in that a first interconnection extending in a first direction over rectangular unit areas placed continuously in plural form in the first direction and provided with transistors for constituting each of the logic circuits is formed, a second interconnection extending in the first direction is formed along the rectangular unit areas and outside the unit areas, intermediate areas are respectively provided between the adjacent unit areas, a third interconnection is formed extending in a second direction orthogonal to the first direction, formed in any intermediate area and connected to the second interconnection, a signal inputted to the logic circuit in the unit area corresponding to the intermediate area with the third interconnection formed therein is received from the first interconnection and the third interconnection, and a signal inputted to the logic circuit in the unit area corresponding to each intermediate area with no third interconnection formed therein is received from the first interconnection, whereby an input signal region is ensured regardless of the layout of the unit areas, thereby making it possible to greatly reduce non-connections even with a wiring design using automatic wiring technology.

(14) A still further advantageous effect can be obtained in that a first interconnection extending in a first direction is formed over rectangular unit areas placed in plural form in the first direction and provided with one or plural circuit devices for implementing specific logic functions, a second interconnection extending in the first direction is formed along the rectangular unit areas and outside the unit areas, wiring dedicated areas each of which is provided adjacent to the unit areas and in which a third interconnection extending in a second direction orthogonal to the first direction is formed, are provided, and the third interconnection in each wiring dedicated area is used for the transfer of a signal between the circuit devices for implementing the logic functions, which are formed in the unit areas, and the second interconnection, whereby an input signal region is ensured regardless of the layout of the unit areas, thereby making it possible to greatly reduce non-connections even with a wiring design using the automatic wiring technology.

Although the invention has been described specifically based on certain illustrated embodiments, the invention is not necessarily limited to the aforementioned embodiments. It is needless to say that many changes can be made to the invention within a scope not departing from the substance thereof one circuit block may be constructed by utilizing, for example, a cell having a logic function inclusive of each wiring dedicated area, a cell having a logic function alone and a cell formed by a wiring dedicated area alone in combination. Namely, cells in which the number of input terminals is relatively great, are layout-designed inclusive of the wiring dedicated area, and cells in which the number of input terminals is reduced as in the case of 1 or 2, for example, are not provided with the wiring dedicated areas. In this condition, the cells formed by the wiring dedicated area alone may be disposed adjacent to each other according to circuit configurations.

In the dynamic RAM shown in FIG. 10, the configurations of the memory arrays, sub-arrays and sub-word drivers can take various forms. The input/output interfaces of the dynamic RAM can take various forms such as those made compliant with synchronous specifications, LAN-bus specifications, etc. The word line may adopt a word-shunt system in addition to the hierarchy word-line system.

The semiconductor integrated circuit device according to the present invention can be widely used in other semiconductor memory devices such as a static RAM, etc. as well as the dynamic RAM, or various digital integrated circuit devices such as a one-chip microcomputer having a random/logic portion, etc.

Effects obtained by a typical one of the features disclosed in the present application will briefly be described as follows. Namely, a plurality of unit regions or areas in which one or plural MOSFETs for implementing a specific logic circuit are formed, are placed in a first direction, a first interconnection extending in the first direction is formed over the unit areas, a second interconnection extending in the first direction is formed along the unit areas and outside the unit areas, and each of the wiring dedicated areas provided with a third interconnection extending in a second direction orthogonal to the first direction is provided between the adjacent unit areas, a logic circuit in each unit area is constructed so as to have both a first connection form connected to the first interconnection and a second connection form connected to the third interconnection through the second interconnection according to combinations with the wiring dedicated areas adjacent thereto as needed, whereby an input signal region is ensured regardless of the layout of each cell, thereby making it possible to greatly reduce non-connections or non-wire bonding even with a wiring design using automatic wiring technology.

What is claimed is:

1. A semiconductor integrated circuit device comprising:
   unit areas placed in plural form in a first direction;
   a first line extending in the first direction over said plurality of unit areas;
   a second line extending in the first direction along said plurality of unit areas and outside said plurality of unit areas; and
   wiring areas provided adjacent to a first unit area of said plurality of unit areas and provided with a third line extending in a second direction, intersecting the first direction,
   wherein said first unit area has a MOSFET formed therein,
   wherein said third line has a first terminal connected electrically to said second line and a second terminal connected electrically to said MOSFET, and
   wherein said third line is separated from said first line electrically.

2. A semiconductor integrated circuit device comprising:
   unit areas placed in plural form in a first direction;
   a first line, formed with a first layer, extending in the first direction over said plurality of unit areas;
   a second line extending in the first direction along said plurality of unit areas and outside said plurality of unit areas; and
   wiring areas provided adjacent to a first unit area of said plurality of unit areas and provided with a third line;
   wherein said first unit area has a circuit formed therein,
   wherein said third line has a first terminal connected electrically to said second line and a second terminal connected electrically to said circuit,
   wherein said third line is formed with a second layer which is different from said first layer, and
   wherein said third line is separated from said first line electrically.

3. A semiconductor integrated circuit device according to claim 2,
   wherein said second layer is formed by a single layer.

* * * * *